(12) United States Patent
Graettinger

(10) Patent No.: US 7,498,629 B2
(45) Date of Patent: Mar. 3, 2009

(54) STUD ELECTRODE AND PROCESS FOR MAKING SAME

(75) Inventor: Thomas M. Graettinger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/786,219

(22) Filed: Apr. 11, 2007

(65) Prior Publication Data

US 2007/0187738 A1 Aug. 16, 2007

Related U.S. Application Data

(60) Continuation of application No. 11/215,922, filed on Aug. 30, 2005, now Pat. No. 7,271,072, which is a division of application No. 10/634,163, filed on Aug. 5, 2003, now Pat. No. 7,230,292.

(51) Int. Cl.
    *H01L 29/92* (2006.01)
(52) U.S. Cl. ............................ 257/309; 257/E29.342
(58) Field of Classification Search .............. 257/309, 257/E29.342
    See application file for complete search history.

(56) References Cited

U.S. PATENT DOCUMENTS

| | | | |
|---|---|---|---|
| 4,025,411 A | 5/1977 | Hom-Ma et al. |
| 4,350,729 A | 9/1982 | Nakano et al. |
| 4,444,618 A | 4/1984 | Saia et al. |
| 4,863,559 A | 9/1989 | Douglas |
| 5,108,542 A | 4/1992 | Lin |
| 5,185,058 A | 2/1993 | Cathey, Jr. |
| 5,270,259 A | 12/1993 | Ito et al. |
| 5,294,294 A | 3/1994 | Namose |
| 5,372,974 A | 12/1994 | Doan et al. |
| 5,397,432 A | 3/1995 | Konno et al. |
| 5,405,806 A | 4/1995 | Pfiester et al. |
| 5,515,984 A | 5/1996 | Yokoyama et al. |
| 5,599,743 A | 2/1997 | Nakagawa et al. |
| 5,614,438 A | 3/1997 | Evans, Jr. et al. |
| 5,651,856 A | 7/1997 | Keller et al. |
| 5,670,019 A | 9/1997 | Huang |
| 5,691,235 A | 11/1997 | Meikle et al. |
| 5,834,348 A | 11/1998 | Kwon et al. |
| 5,840,200 A | 11/1998 | Nakagawa et al. |
| 5,843,830 A | 12/1998 | Graettinger et al. |
| 5,856,707 A | 1/1999 | Sardella |
| 5,930,639 A | 7/1999 | Schuele et al. |
| 6,048,763 A | 4/2000 | Doan et al. |
| 6,049,101 A | 4/2000 | Graettinger et al. |
| 6,083,803 A | 7/2000 | Fischer et al. |
| 6,146,961 A | 11/2000 | Graettinger et al. |
| 6,149,828 A | 11/2000 | Vaartstra |
| 6,159,818 A | 12/2000 | Durcan et al. |
| 6,190,960 B1 | 2/2001 | Noble |

(Continued)

*Primary Examiner*—W. David Coleman
(74) *Attorney, Agent, or Firm*—Schwegman, Lundberg & Woessner, P.A.

(57) ABSTRACT

A process of making a stud capacitor structure is disclosed. The process includes embedding the stud in a dielectric stack. In one embodiment, the process includes forming an electrically conductive seed film in a contact corridor of the dielectric stack. A storage cell stud is also disclosed. The storage cell stud can be employed in a dynamic random-access memory device. An electrical system is also disclosed that includes the storage cell stud.

23 Claims, 12 Drawing Sheets

U.S. PATENT DOCUMENTS

| | | |
|---|---|---|
| 6,239,461 B1 | 5/2001 | Lee |
| 6,249,040 B1 | 6/2001 | Lin et al. |
| 6,280,793 B1 | 8/2001 | Atwell et al. |
| 6,281,091 B1 | 8/2001 | Durcan et al. |
| 6,291,289 B2 | 9/2001 | Rhodes et al. |
| 6,319,832 B1 | 11/2001 | Uhlenbrock et al. |
| 6,325,017 B1 | 12/2001 | DeBoer et al. |
| 6,326,218 B1 | 12/2001 | Yunogami et al. |
| 6,329,263 B1 | 12/2001 | Durcan et al. |
| 6,333,240 B1 | 12/2001 | Durcan et al. |
| 6,342,277 B1 | 1/2002 | Sherman |
| 6,348,709 B1 | 2/2002 | Graettinger et al. |
| 6,388,282 B1 | 5/2002 | Hieda |
| 6,388,284 B2 | 5/2002 | Rhodes et al. |
| 6,391,735 B1 | 5/2002 | Durcan et al. |
| 6,395,600 B1 | 5/2002 | Durcan et al. |
| 6,395,601 B2 | 5/2002 | Hong et al. |
| 6,429,086 B1 | 8/2002 | Meikle et al. |
| 6,445,023 B1 | 9/2002 | Vaartstra et al. |
| 6,461,982 B2 | 10/2002 | DeBoer et al. |
| 6,468,874 B1 | 10/2002 | Yu et al. |
| 6,472,323 B1 | 10/2002 | Meikle et al. |
| 6,495,459 B2 | 12/2002 | Uhlenbrock et al. |
| 6,528,834 B1 | 3/2003 | Durcan et al. |
| 6,573,199 B2 | 6/2003 | Sandhu et al. |
| 6,608,342 B1 | 8/2003 | Durcan et al. |
| 6,613,702 B2 | 9/2003 | Sandhu et al. |
| 6,620,680 B2 | 9/2003 | Durcan et al. |
| 6,656,839 B2 | 12/2003 | Uhlenbrock et al. |
| 6,661,048 B2 | 12/2003 | Yamanaka et al. |
| 6,661,051 B1 | 12/2003 | Durcan et al. |
| 6,664,159 B2 | 12/2003 | Vaartstra et al. |
| 6,666,986 B1 | 12/2003 | Vaartstra |
| 6,683,005 B2 | 1/2004 | Sandhu et al. |
| 6,690,044 B1 | 2/2004 | Doan et al. |
| 6,693,319 B1 | 2/2004 | Durcan et al. |
| 6,720,272 B2 | 4/2004 | Sandhu et al. |
| 6,730,954 B2 | 5/2004 | Meikle et al. |
| 6,753,563 B2 | 6/2004 | Havemann |
| 6,753,565 B1 | 6/2004 | Durcan et al. |
| 6,764,956 B2 | 7/2004 | Sandhu et al. |
| 6,773,495 B2 | 8/2004 | Uhlenbrock et al. |
| 6,784,049 B2 | 8/2004 | Vaartstra |
| 6,815,754 B2 | 11/2004 | Clampitt |
| 6,847,077 B2 | 1/2005 | Thomas et al. |
| 6,903,398 B2 | 6/2005 | Yamamoto |
| 7,002,201 B2 | 2/2006 | Yasuda |
| 7,056,788 B2 | 6/2006 | Nakamur |
| 7,230,292 B2 * | 6/2007 | Graettinger ................. 257/309 |
| 7,271,072 B2 | 9/2007 | Graettinger |
| 2001/0020448 A1 | 9/2001 | Vaartstra et al. |
| 2001/0023100 A1 | 9/2001 | Hong et al. |
| 2001/0024387 A1 | 9/2001 | Raaijmakers et al. |
| 2001/0025974 A1 | 10/2001 | Gealy et al. |
| 2001/0036752 A1 | 11/2001 | Deboer et al. |
| 2002/0045322 A1 | 4/2002 | Meikle et al. |
| 2002/0079581 A1 | 6/2002 | Graettinger et al. |
| 2002/0094634 A1 | 7/2002 | Chung et al. |
| 2002/0098654 A1 | 7/2002 | Durcan et al. |
| 2002/0125508 A1 | 9/2002 | Durcan et al. |
| 2002/0146850 A1 | 10/2002 | Choi |
| 2002/0187654 A1 | 12/2002 | DeBoer et al. |
| 2003/0203588 A1 | 10/2003 | Song et al. |
| 2004/0043633 A1 | 3/2004 | Vaartstra |
| 2004/0043636 A1 | 3/2004 | Vaartstra et al. |
| 2005/0032346 A1 | 2/2005 | Graettinger |
| 2006/0014369 A1 | 1/2006 | Graettinger |

* cited by examiner

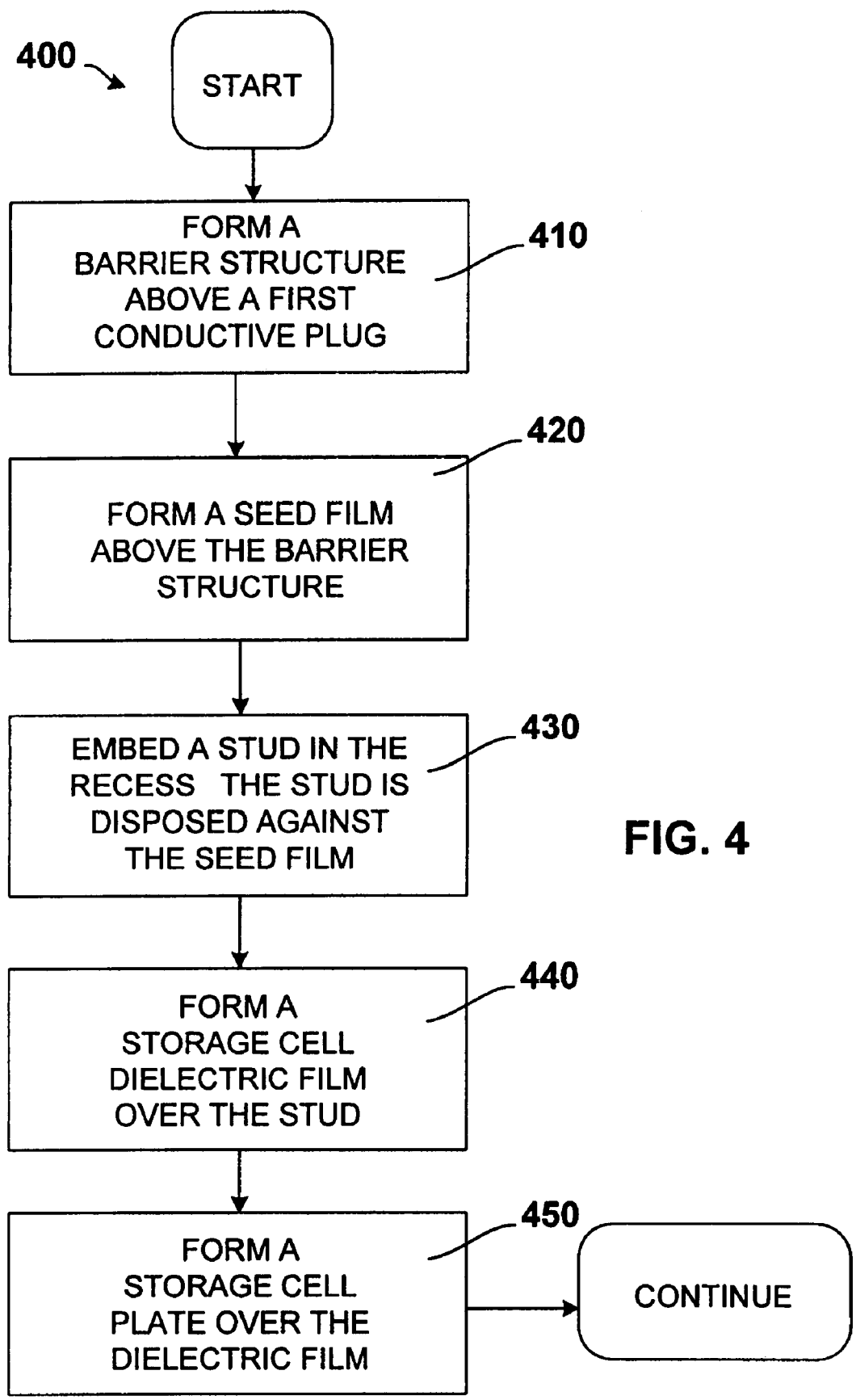

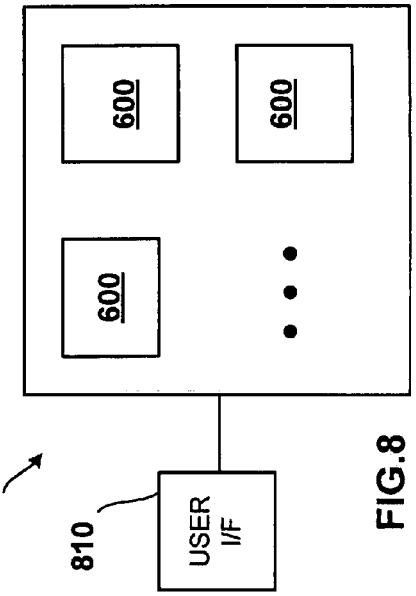
FIG. 6
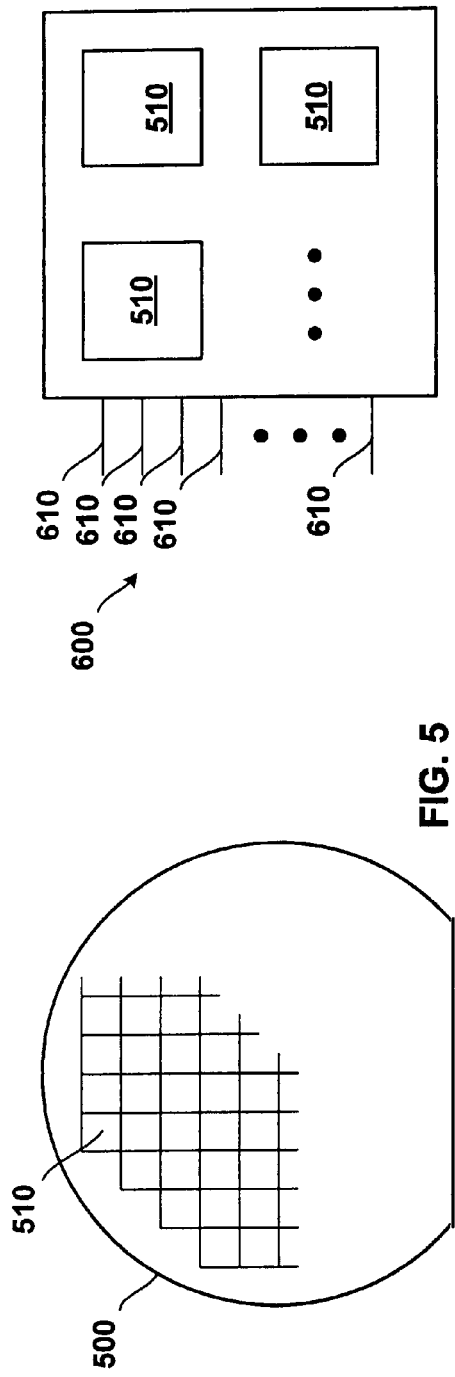
FIG. 5
FIG. 8
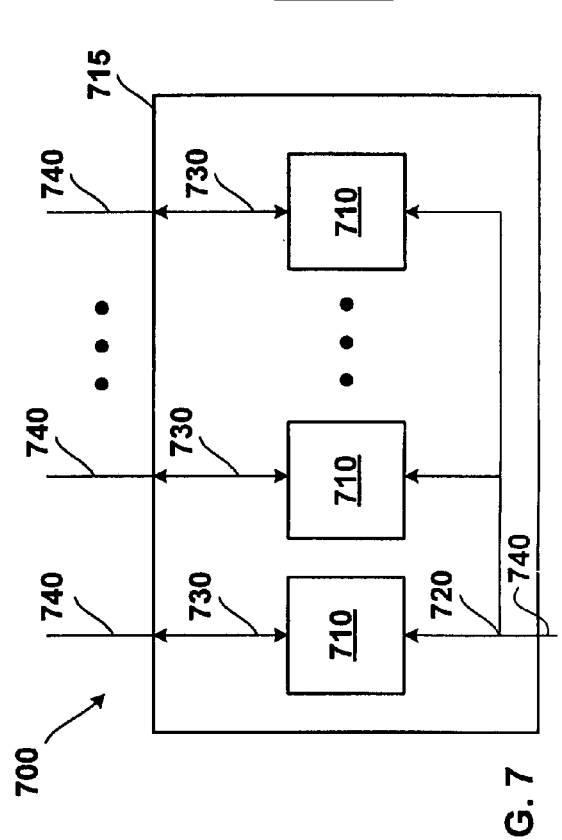
FIG. 7

STUD ELECTRODE AND PROCESS FOR MAKING SAME

This application is a Continuation of U.S. application Ser. No. 11/215,922, filed Aug. 30, 2005, which is a Divisional of U.S. application Ser. No. 10/634,163, filed Aug. 5, 2003, which is incorporated herein by reference.

TECHNICAL FIELD

The technical field relates to semiconductor processing. More particularly, one embodiment relates to a process of making a stud electrode.

BACKGROUND

Semiconductor processing is an intensive activity during which the fabrication of several devices is integrated to achieve a working microelectronic device. Miniaturization is the process of crowding more semiconductive devices onto a smaller substrate area in order to achieve better device speed, lower energy usage, and better device portability, among others. New processing methods must often be developed to enable miniaturization to be realized.

As the footprint of a DRAM cell has continued to decrease in size, the need for a large capacitor has remained. As the container capacitor is physically shrunk, the inner surface of the storage node becomes relatively smaller due to issues such as photolithography limitations and sloping sidewalls from the etch process. Thus, what is needed is a data storage device that overcomes some of the challenges of the prior art.

BRIEF DESCRIPTION OF THE DRAWINGS

In order to illustrate the manner in which embodiments are obtained, a more particular description will be rendered by reference to specific embodiments which are illustrated in the appended drawings. Understanding that these drawings depict only typical embodiments that are not necessarily drawn to scale and are not therefore to be considered to be limiting of its scope, the invention will be described and explained with additional specificity and detail through the use of the accompanying figures in which:

FIG. 4 is a process flow diagram that illustrates various exemplary process embodiments that relate to FIGS. 3, 3A, 3B, 3C, 3D, 3E, 3F, and 3G;

FIG. 5 is a top view of a wafer or substrate containing semiconductor dies in accordance with an embodiment;

FIG. 6 is a block diagram of a circuit module in accordance with an embodiment;

FIG. 7 is a block diagram of a memory module in accordance with an embodiment;

FIG. 8 is a block diagram of an electronic system in accordance with another embodiment;

DETAILED DESCRIPTION

Figure 1:
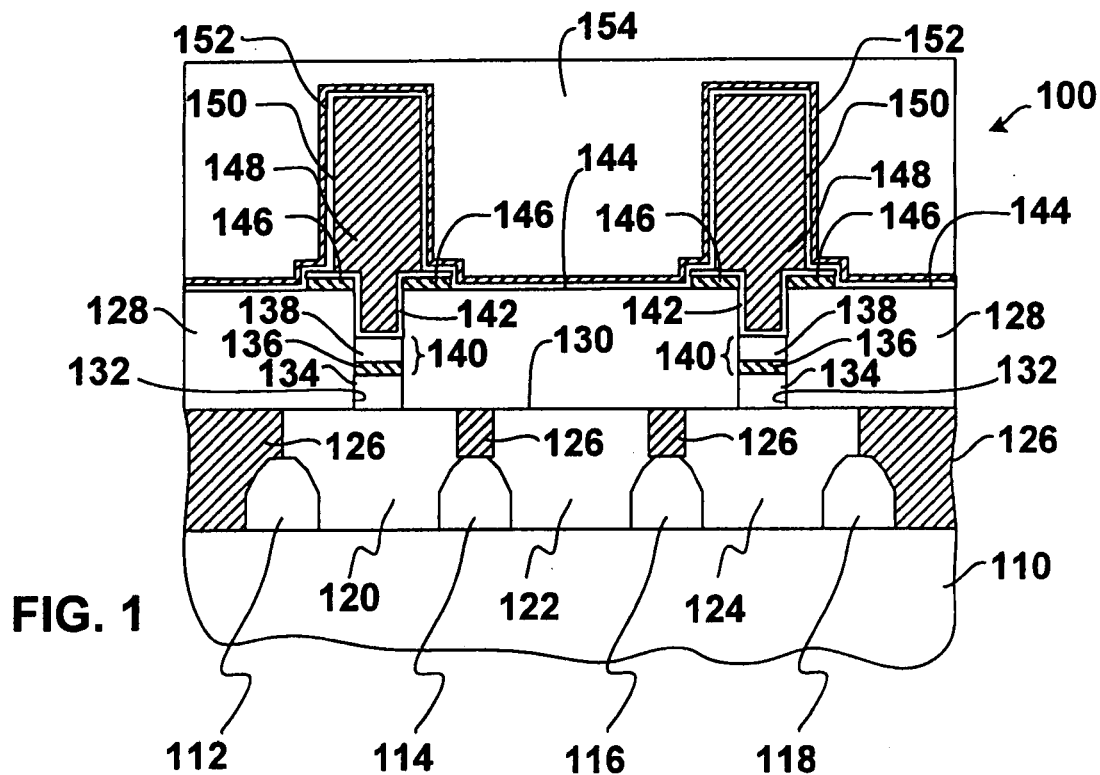
FIG. 1 is a cross section of a stud capacitor structure according to an embodiment.

In the following detailed description, reference is made to the accompanying drawings which form a part hereof, and in which is shown, by way of illustration, specific ways which embodiments may be practiced. In the drawings, like numerals describe substantially similar components throughout the several views. These embodiments are described in sufficient detail to enable those skilled in the art to practice various embodiments. Other embodiments may be utilized and structural, logical, and electrical changes may be made without departing from the scope of the various embodiments. The terms wafer and substrate used in the following description include any structure having an exposed surface with which to form an integrated circuit ("IC") structure embodiment.

The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "above", "lower", "over", "below", and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 is a cross section of a stud capacitor structure 100 according to an embodiment. A substrate 110 includes an active area (not pictured) and a series of gate stacks 112, 114, 116, and 118. Between the gate stacks 112 and 114 is a first cell first conductive plug 120. Between the gate stacks 114 and 116 is a digit line conductive plug 122. And between the gate stacks 116 and 118 is a second cell first conductive plug 124. By way of non-limiting example, the cell first conductive plugs 120, 124 and the digit line conductive plug 122 are isolated from each other by a dielectric 126. Each of the conductive plugs 120 and 124 can be referred to as a cell first conductive plug.

A first dielectric stack 128 is disposed above an upper surface 130 of the first cell conductive plugs 120, 124 and the digit line conductive plug 122. A contact corridor 132 is opened in the first dielectric stack 128, and a second conductive plug 134 is disposed in the contact corridor 132 in immediate contact with the upper surface 130 of the cell first conductive plugs 120 and 122. A first barrier film 136 is disposed in immediate contact with the second conductive plug 134. A second barrier film 138 is disposed in immediate contact with the first barrier film 136. In one embodiment, the first barrier film 136 and the second barrier film 138 are referred to as a barrier structure 140.

A landing pad seed film 142 is disposed in the contact corridor 132 in a conformal manner such that it can have a portion that is within the contact corridor 132 and a portion that is above the upper surface 144 of the first dielectric stack 128. In one embodiment, the seed film 142 has masked a protective film 146 that was used in processing. The protective film 146 is a remnant of processing conditions.

A storage cell stud 148 is embedded in the contact corridor 132. Additionally, the storage cell stud 148 partially extends above the upper surface 144 of the first dielectric stack 128. The storage cell stud 148 is used as the stud electrode for a stud capacitor that is one embodiment. A storage cell dielectric film 150 is disposed over the storage cell stud 148. Finally as to the stud capacitor structure 100, a storage cell plate 152 is disposed over the storage cell dielectric film 150. Incidental to the stud capacitor structure 100, an upper dielectric stack 154 covers the other structures. The upper dielectric stack 154 is referred to as such because of processing conditions, set forth below.

FIG. 1 illustrates a two-cell stud capacitor structure 100. A digit line (not pictured), in one embodiment a buried digit line, is to be brought into contact with the digit line conductive plug 122. Thereby, the stud capacitors can be accessed according to an embodiment. In one embodiment, the gate stack 114 is activated and the left cell either sends or receives a charge through the digit line conductive plug 122. In another embodiment, the gate stack 116 is activated and the right cell either sends or receives a charge through the digit line conductive plug 122.

Figure 1A:
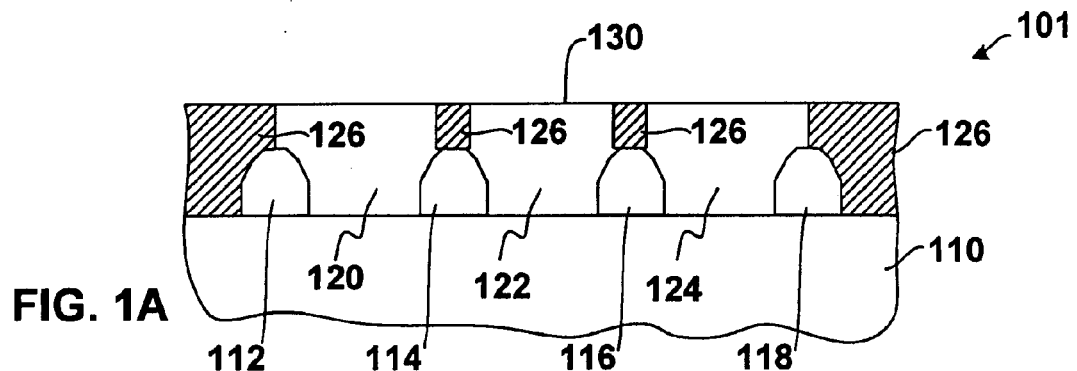
FIG. 1A is a cross section of the stud capacitor structure depicted in FIG. 1 during processing according to an embodiment.

FIG. 1A is a cross section of the stud capacitor structure during processing according to an embodiment. The structure is subjected to various processes to arrive at the stud capacitor structure 101 depicted in FIG. 1A. In one embodiment, the upper surface 130 has been formed after a poly-fill-and-etch process. The poly-fill-and-etch process has resulted in the first cell first conductive plug 120, the digit line conductive plug 122, and the second cell first conductive plug 124. In one embodiment, the upper surface 130 is achieved by a chemical-mechanical polishing (CMP) process. In one embodiment an etchback process is used to achieve the upper surface 130. In one embodiment, the polysilicon material for the conductive plugs is an n-doped polysilicon that can be in situ doped during a chemical vapor deposition ("CVD") process. In one embodiment, the polysilicon precursor material for the conductive plugs is a p-doped polysilicon that can be in situ doped during a CVD process.

Figure 1B:
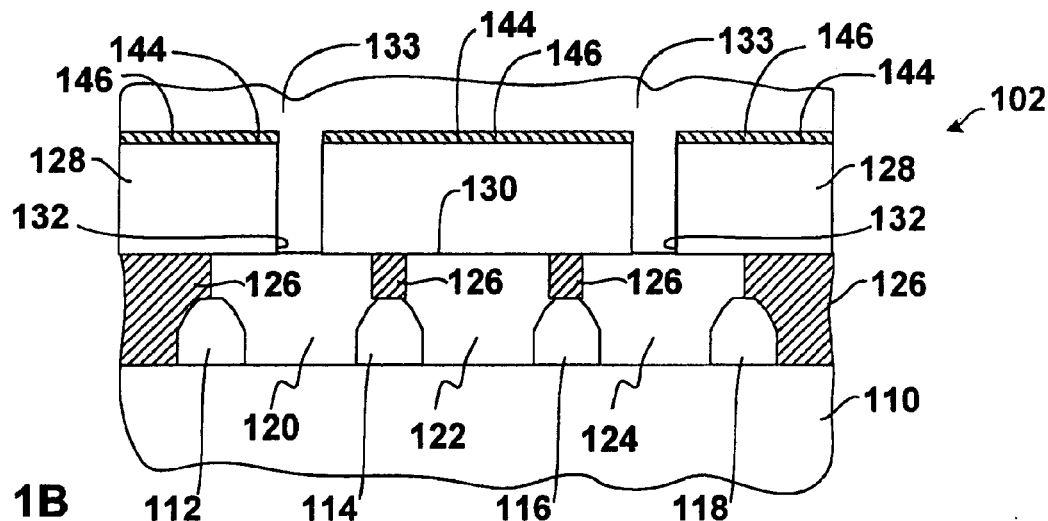
FIG. 1B is a cross section of the structure depicted in FIG. 1A after further processing.

FIG. 1B is a cross section of the structure depicted in FIG. 1A after further processing. The stud capacitor structure 102 has been blanket deposited with the first dielectric stack 128, and the protective film 146. In one embodiment, the first dielectric stack 128 is an oxide such as silicon oxide. In one embodiment, the first dielectric stack 128 is formed by the decomposition of tetraethyl ortho silicate ("TEOS"). In one embodiment, the first dielectric stack 128 is formed by CVD of borophospho silicate glass ("BPSG"). In one embodiment, the first dielectric stack 128 is formed by CVD of phospho silicate glass ("PSG"). In one embodiment, the first dielectric stack 128 is formed by CVD of borosilicate glass ("BSG").

The protective film 146 is formed over the first dielectric stack 128 after an optional planing operation thereon such as by CMP or etchback. The protective film 146 can have a response to an etch process that is different from other materials it contacts. In one embodiment, the protective film 146 is selected from titanium (Ti), zirconium (Zr), hafnium (Hf), or combinations thereof. In one embodiment, the protective film 146 is selected from vanadium, (V), niobium (Nb), tantalum, (Ta), or combinations thereof. In one embodiment, the protective film 146 is selected from chromium (Cr), molybdenum (Mo), tungsten (W), or combinations thereof. In one embodiment, the protective film 146 is selected from cobalt (Co), rhodium (Rh), iridium (Ir), or combinations thereof. In one embodiment, the protective film 146 is selected from nickel (Ni), palladium (Pd), platinum (Pt), or combinations thereof. In one embodiment, the protective film 146 is made from a silicide of one of the above elements or their combinations. In one embodiment, the protective film 146 is made from a nitride of one of the above elements or their combinations. In one embodiment, the protective film 146 is made from a silicide-nitride of one of the above elements or their combinations.

The contact corridor 132 has been opened to expose the first and second cell first conductive plugs 120 and 124, respectively, but the digit line conductive plug 122 remains unexposed by the process. Thereafter, a precursor polysilicon 133 of the second conductive plug 134 (FIG. 1) is formed in the contact corridor 132 and over the protective film 146. In one embodiment, the precursor polysilicon is formed by a CVD of an in situ doped polysilicon seed material.

Figure 1C:
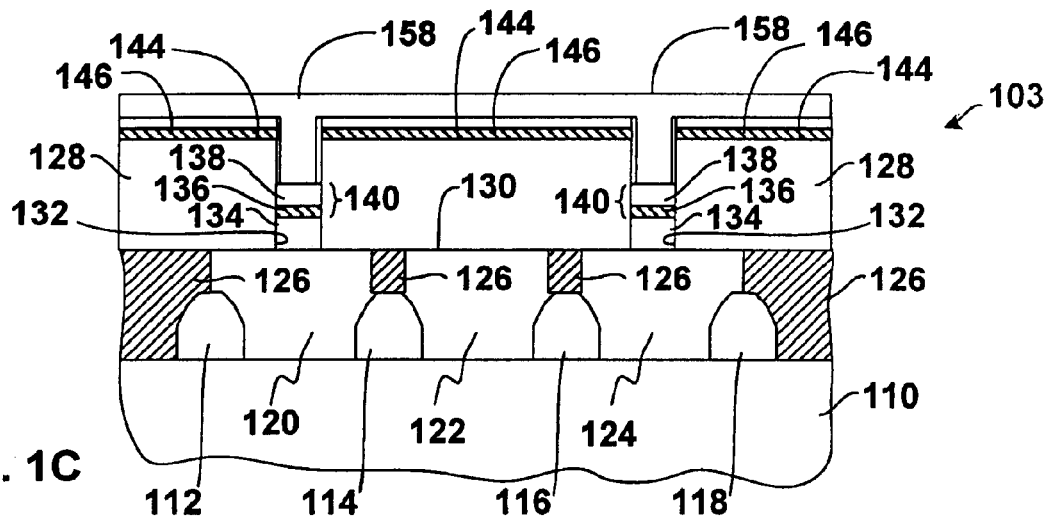
FIG. 1C is a cross section of the structure depicted in FIG. 1B after further processing.

FIG. 1C is a cross section of the structure depicted in FIG. 1B after further processing. The stud capacitor structure 103 has been processed to remove some of the precursor polysilicon 133. The precursor polysilicon 133 (FIG. 1B) has been etched back to create a recess within the contact corridor 132 and to form what will become the second conductive plug 134. The depth within the contact corridor from the upper surface 144 of the first dielectric stack, down to the second conductive plug 134 can be in a range from about 100 Å and about 3,000 Å. In one embodiment, the depth is in a range from about 200 Å and about 2,500 Å. In one embodiment, the depth is in a range from about 500 Å and about 2,000 Å. But before the second conductive plug 134 is finished in its dimensions, a salicidation of the second conductive plug 134 is carried out to form the first barrier film 136. In one embodiment, the first barrier film 136 is made by the deposition of a material such as one of the refractory metals or their combinations set forth above, followed by a salicidation process.

Thereafter the unsalicided refractory metal is rinsed or otherwise removed according to conventional technique that is selective to the first barrier film 136, the first dielectric stack 128, and the protective film 146. In one embodiment, the first barrier film 136 is a metal silicide material, $M_xSi_y$, and the ratios of x to y include both stoichiometric occurrences of metal silicide and other solid solutions.

After removal of unsalicided material that was used to form the first barrier film 136, the second barrier film 138 is formed. In one embodiment, a physical vapor deposition ("PVD") process is used to minimize wall coverage on the contact corridor 132. In one embodiment, the second barrier film 138 is a refractory metal nitride material that is sputtered. The refractory metal nitride can include a nitride of one of the refractory metals or their combinations as set forth above. In one embodiment, a collimated sputtering is carried out in order to minimize deposition on the walls of the contact corridor. In one embodiment, a tantalum nitride second barrier film 138 is formed upon the first barrier film 136. In one embodiment, the second barrier film 138 is a refractory metal silicide. In one embodiment, the second barrier film 138 is a refractory metal silicide-nitride. In one embodiment, the second barrier film 138 is tantalum nitride that can be in either stoichiometric or other solid-solution ratios.

A mask 158 is formed to fill the contact corridor 132, and excess second barrier film 138 is removed, while the second barrier film 138 within the contact corridor 132 is protected by the mask 158. The excess second barrier film 138 is etched according to a conventional etch recipe that is selective to the protective film 146.

Figure 1D:
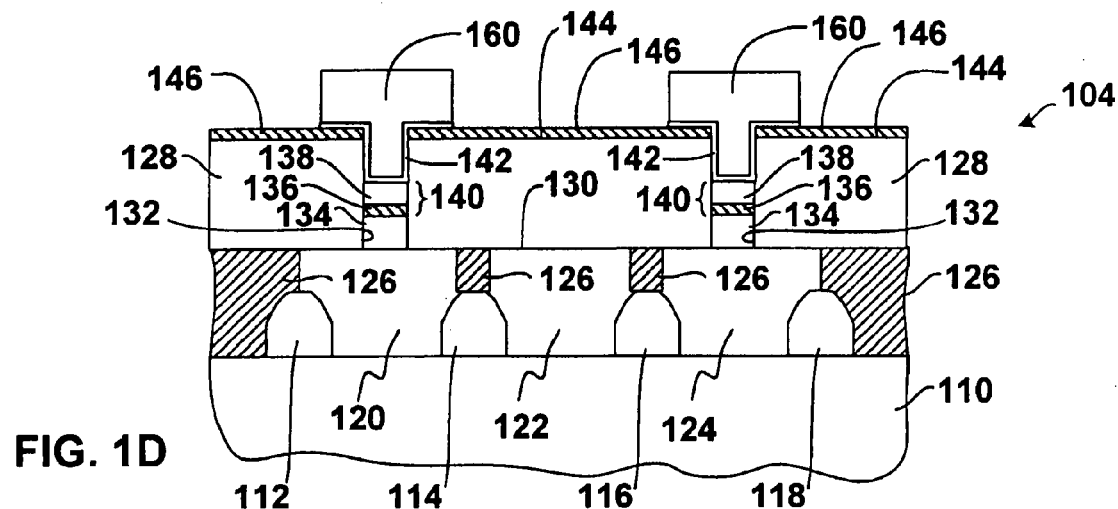
FIG. 1D is a cross section of the structure depicted in FIG. 1C after further processing.

FIG. 1D is a cross section of the structure depicted in FIG. 1C after further processing. The stud capacitor structure 104 is patterned with a landing pad seed film 142 that will assist in the deposition of the storage cell stud 148 (FIG. 1). In one embodiment, deposition is carried out by CVD. In one embodiment, deposition is carried out by atomic-layer deposition ("ALD"). In one embodiment, deposition is carried out by PVD. After formation of the second barrier film 138 the contact corridor 132 is partially filled, but it has a sufficient recess to receive a stud. The seed film 142 is formed by a deposition process. The seed film 142 is used to facilitate subsequent through-hole deposition of a selected stud material. In one embodiment, the seed film 142 is one of the metals or their combinations as set forth above. In one embodiment, the seed film 142 is formed by CVD such that a conformal film coats the sidewalls of the unfilled portions of the contact corridor 132. Thereafter, a mask 160 is patterned, and the excess seed film 142 is removed by an etch that stops on the protective film 146.

In one embodiment, the seed film 142 includes substantially the same metal as will be deposited by through-hole deposition to form the storage cell stud 148. In one embodiment, a metal that is not the same as the storage cell stud 148 is used as the seed film 142. For example, the same unit cell structure such as according to the Miller-Bravais lattice system is selected. In one embodiment, the seed film 142 includes a platinum material in anticipation of the storage cell stud 148 being substantially the same platinum that will be formed by through-hole deposition according to known technique. In one embodiment, the seed film 142 includes a rhodium material in anticipation of the storage cell stud 148 being substantially the same material. In one embodiment, the seed film 142 includes a ruthenium material in anticipation of the storage cell stud 148 being substantially the same material. In one embodiment, the seed film 142 includes an iridium material in anticipation of the storage cell stud 148 being substantially the same material. In one embodiment, the seed film 142 includes a palladium material in anticipation of the storage cell stud 148 being substantially the same material. In one embodiment, the seed film 142 includes an alloy material. In one embodiment, the seed film 142 includes an alloy of one of the above materials.

The size of the mask 160 is depicted in FIG. 1D to overlap the contact corridor 132, onto the protective film 146. In one embodiment, the size of the mask 160 can be narrower, such that there is substantially no seed film 142 material in vertical contact with the protective film 146. Etching is carried out to remove unmasked portions of the seed film 142, and to stop on the protective film 146 if it is present.

Figure 1E:
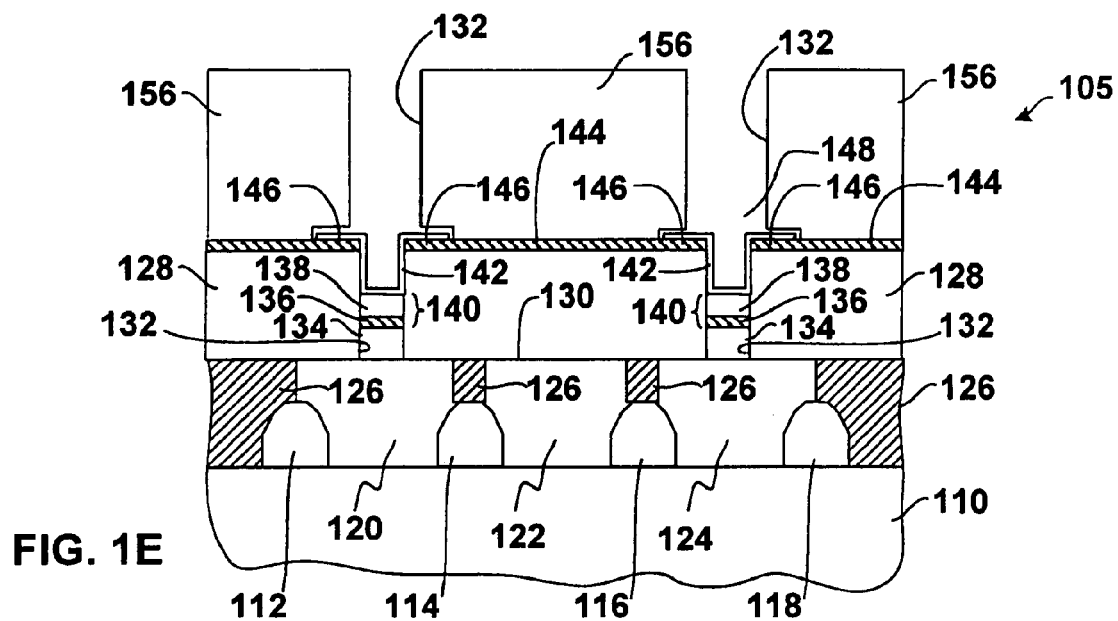
FIG. 1E is a cross section of the structure depicted in FIG. 1D after further processing.

FIG. 1E is a cross section of the structure depicted in FIG. 1D after further processing. The stud capacitor structure 105 has been blanket deposited with the second dielectric stack 156. The second dielectric stack 156 is depicted as having been patterned and etched such that the contact corridor 132 has been re-opened and probably widened within the second dielectric stack 156 due to processing limitations. At this process flow, the stud capacitor structure 105 is prepared to receive a storage cell stud.

Figure 1F:
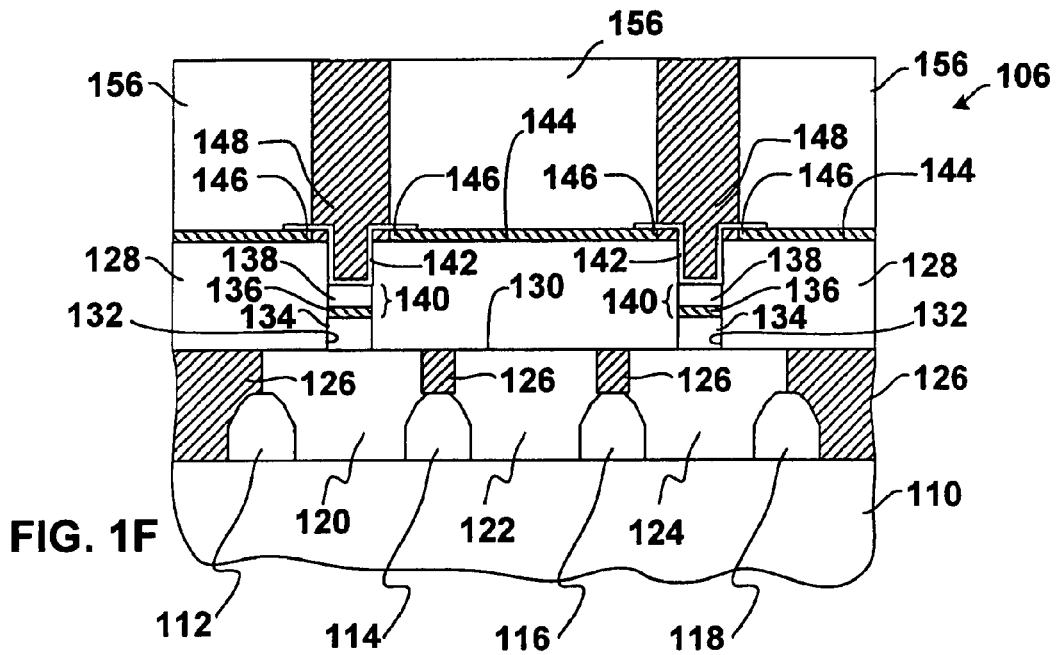
FIG. 1F is a cross section of the structure depicted in FIG. 1E after further processing.

FIG. 1F is a cross section of the structure depicted in FIG. 1E after further processing. The stud capacitor structure 106 has been processed to form the storage cell stud 148. In one embodiment, the seed film 142 is used as a nucleation site to assist metal deposition. In one embodiment, an electrolytic through-hole deposition process is used to form the storage cell stud 148. Because the seed film 142 initially coats the sidewalls of the contact corridor 132, initial deposition can be more rapid due to the increased surface area caused by the coated sidewalls. However, as deposition at all other conditions being unchanged, is a function of surface area, deposition can become substantially steady once the storage cell stud 148 is growing above the level of the protective film 146.

In one embodiment, the seed film 142 is deposited by PVD such that the sidewalls of the contact corridor 132 are substantially uncoated (not pictured). In this embodiment, a substantially unchanging deposition surface is presented to the deposition solution.

In one embodiment, electroplating is carried out by connecting a cathodic charge to the protective film 146, and plating platinum onto the seed film 142. The morphology of the plated storage cell stud 148 can be affected by the chemistry of the plating solution, the morphology of the seed film 142, and the current that is used to deposit the platinum onto the seed film 142. In one embodiment, the electroplating conditions include a current from about 1 milliAmpere (mA) to about 10 mA. The applied voltage is in the range from about −2 Volt to about 2 Volt. The temperature is from about 50° C. to about 100° C. The starting concentration of platinum ions in solution is from about 1 mole/L to about 10 mole/L.

In one embodiment, an electroless plating process is carried out. In one embodiment, electroless plating is done under conditions that cause a relatively large solution mass to contact a relatively small surface area of the seed film 142. In one variation of this embodiment, the volume of the plating solution is diminished no more than about 50% of its dissolved platinum ions, if platinum is the material to be deposited. In one variation of this embodiment, the volume of the plating solution is diminished no more than about 10% of its dissolved platinum ions. In one variation of this embodiment, the volume of the plating solution is diminished no more than about 5% of its dissolved platinum ions. Consequently, the platinum concentration is sufficiently large so as to not cause the deposition chemistry to be significantly affected.

In one embodiment for electroless plating, the starting concentration of platinum ions, from a source of $H_2PtCl_6$ in solution, is from about $2.5 \times 10^{-3}$ mole/L to about $2.5 \times 10^{-2}$ mole/L. In one embodiment, the solution includes a reducing agent such as hydrazine dihydrochloride. Other conditions include a pH of about 2, and temperature range from about 65° C. to about 75° C.

In one embodiment, the storage cell stud 148 is formed from one of the metals or their combinations as set forth above. In one embodiment, the storage cell stud 148 is a platinum material. In one embodiment, the storage cell stud 148 is a ruthenium material. In one embodiment, the storage cell stud 148 is an iridium material. In one embodiment, the storage cell stud 148 is a palladium material. In one embodiment, the storage cell stud 148 is an alloy such as an alloy of at least two materials. After deposition is completed, the storage cell stud 148 is planarized as depicted in FIG. 1F.

Figure 1G:
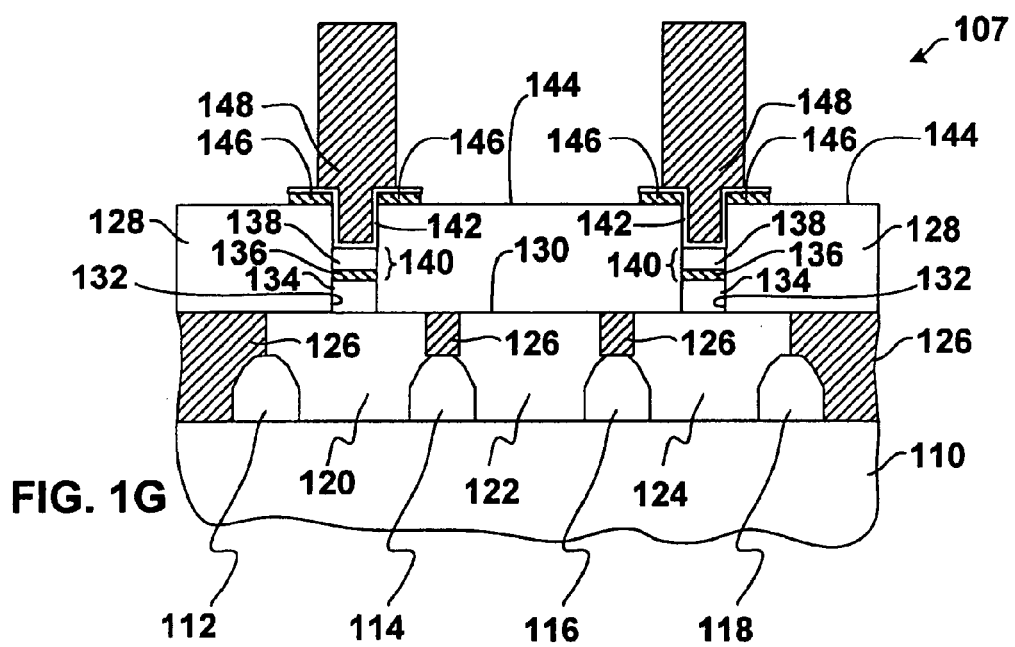
FIG. 1G is a cross section of the structure depicted in FIG. 1F after further processing.

FIG. 1G is a cross section of the structure depicted in FIG. 1F after further processing. The stud capacitor structure 107 has been processed to expose the storage cell stud 148. A rinse or wet etch is carried out to substantially remove the second dielectric stack 156. The protective layer 146 is used during this process as an etch stop to prevent dielectric stack 128 from being etched during the removal of the second dielectric stack 156. The protective layer 146 is also removed from between the studs so that they are electrically isolated from one another. This process can be done with a wet etch such as a dilute ammonium hydroxide solution that is mixed with hydrogen peroxide.

FIG. 1 is a cross section of the structure depicted in FIG. 1G after further processing. The stud capacitor structure 100 has been processed to isolate the storage cell stud 148 from a cell plate. The protective film 146, that has optionally been used as a cathode source in electrolytic deposition of the storage cell stud 148, is removed by an etch (FIG. 1G). In one embodiment, the protective film 146 is dry etched. In one embodiment, the protective film 146 is wet etched, such that some undercutting beneath the seed film 142 can occur. The stud capacitor structure 107 is then ready to receive a storage cell dielectric film and a storage cell plate.

The storage cell dielectric film 150 is next formed. In one embodiment, the storage cell dielectric film 150 is formed by a CVD process. The storage cell dielectric film 150 is deposited to a thickness in a range from about 30 Å to about 80 Å. In one embodiment, the storage cell dielectric film 150 is deposited to a thickness in a range from about 50 Å to about 60 Å.

In one embodiment, a high permittivity material is selected. In one embodiment, a material is deposited by CVD or ALD. In one embodiment, tantalum oxide is deposited by one of CVD or ALD. The storage cell dielectric film 150 can be further annealed in an oxygen environment.

Other materials can be used to form the storage cell dielectric film 150. In one embodiment, alumina is formed. In one embodiment, barium strontium titanate is formed. In one embodiment, strontium titanate is formed. In one embodiment, silicon nitride is formed. In one embodiment, lead-zirconium-titanate ("PZT") is formed. In one embodiment, lead-lanthanum-zirconium-titanate ("PLZT") is formed. In one embodiment, lead-lanthanum-titanate ("PLT") is formed. In one embodiment, strontium bismuth tantalate ("SBT") is formed. In one embodiment, strontium bismuth niobium tantalate ("SBTN") is formed. In one embodiment, strontium bismuth niobium ("SBN") is formed. Other materials known in the art can also be used according to a given application.

Materials with various dielectric constants can be chosen for the storage cell dielectric film 150. In one embodiment, a tantalum pentoxide film is formed that is amorphous as can be measured by a dielectric constant in a range from about 18 to about 20. In one embodiment a tantalum pentoxide film is formed that is substantially crystalline as can be measured by a dielectric constant in a range from about 20 to about 40. In one embodiment, a silicon nitride film is formed that can be measured by a dielectric constant in a range from about 7 to about 8. In one embodiment, an alumina film is formed that can be measured by a dielectric constant in a range from about 9 to about 10. In one embodiment, a film is formed that can be measured to have a dielectric constant in a range from about 9 to about 300.

Processing conditions for the formation of an amorphous tantalum pentoxide film include a temperature in a range from about 400° C. to about 500° C. Processing conditions for the formation of a substantially crystalline tantalum pentoxide film include a temperature in a range from about 700° C. to about 800° C.

After the formation of the storage cell dielectric film 150, the storage cell plate 152 is formed. In one embodiment the storage cell plate 152 is a metal such as any of the metals or combinations that are set forth above. In one embodiment, the storage cell plate 152 is a platinum material, and the storage cell stud 148 is also a platinum material.

After completion of the stud capacitor structure 100, an upper dielectric stack 154 is formed over the stud. In one embodiment, the upper dielectric stack 154 is formed by a conventional CVD process to substantially fill in the spaces between the capacitor structures.

Figure 2:
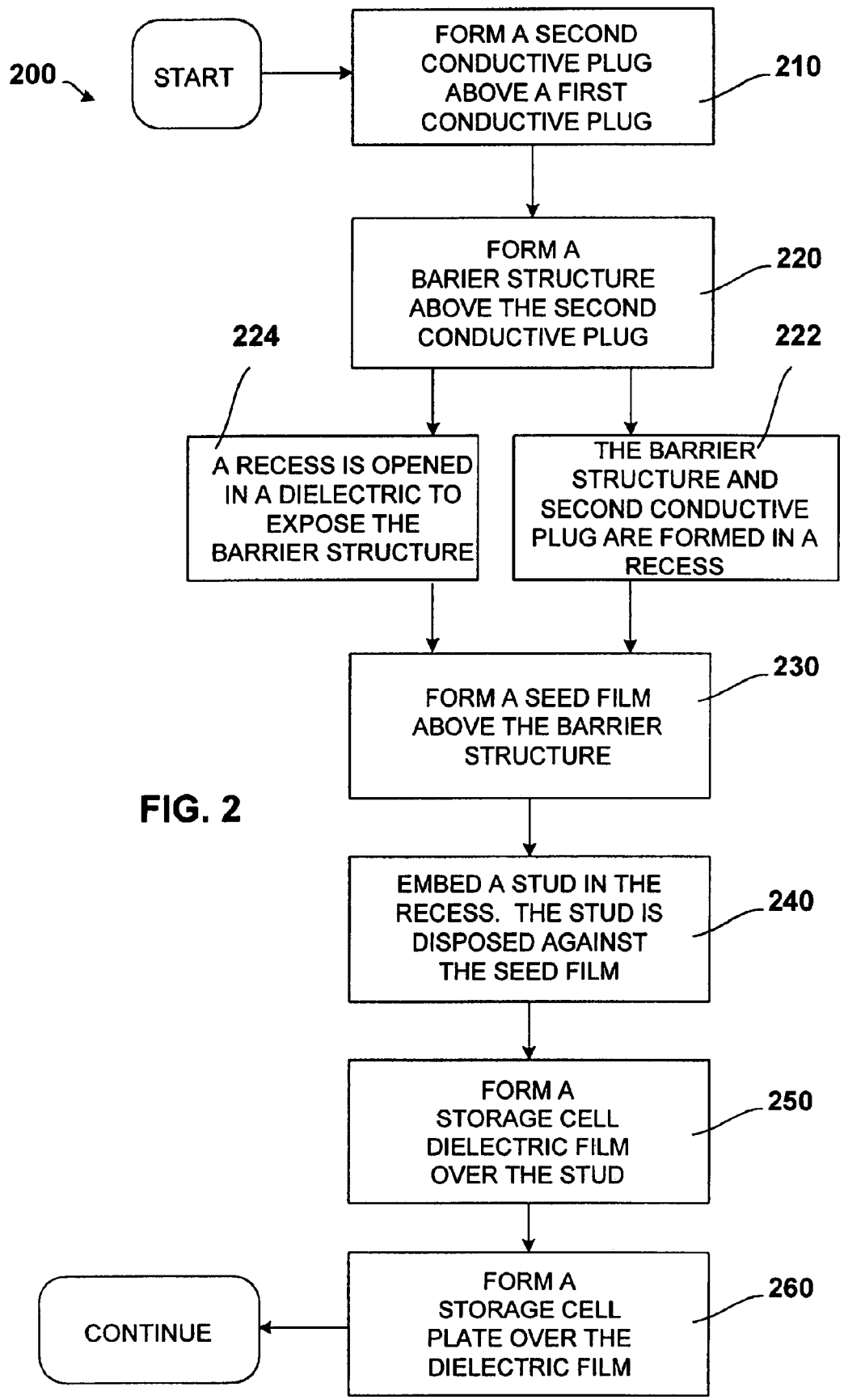
FIG. 2 is a process flow diagram that illustrates various exemplary process embodiments that relate to FIGS. 1, 1A, 1B, 1C, 1D, 1E, 1F, and 1G.

FIG. 2 is a process flow diagram 200 that illustrates various exemplary process embodiments depicted in FIGS. 1A through 1G.

At 210 a second conductive plug is formed above a first conductive plug. Relating to an embodiment depicted in the FIGS., the second conductive plug 134 is formed above the first cell first conductive plug 120.

At 220, a barrier structure is formed above the second conductive plug. Relating to an embodiment depicted in the FIGS., the barrier structure includes the first barrier film 136 and the second barrier film 138. In one embodiment at 222, it is noted that the barrier structure is formed in a recess that is the contact corridor 132.

In an alternative embodiment at 224, it is noted that the barrier structure is formed first on the second conductive plug, and thereafter it is exposed by opening a contact corridor that is substantially coaxial with the contact corridor 132. In this alternative embodiment, the second conductive plug 134, the first barrier film 136 and the second barrier film 138 are patterned as a stack before formation of the first dielectric stack 128. Although other process integration issues arise with this alternative embodiment, it can be utilized where sidewall coverage of the second barrier film 138 in the contact corridor presents a quality and/or yield issue. Further, this alternative embodiment avoids the process of forming the mask 158 (FIG. 1C), the etchback of the polysilicon precursor 133, and the etchback of the second barrier film 138 that is upon the protective film 146 (FIG. 1C).

At 230 a seed film is formed above the barrier structure. Relating to an embodiment depicted in the FIGS., the seed film 142 is formed by a CVD process to coat the protective film 146, the sidewalls of the contact corridor 132, and the exposed surface of the second barrier film 138.

At 240, a stud is embedded in the recess. Relating to an embodiment depicted in the FIGS., the stud is the storage cell stud 148 that is embedded partially in the recess that is the contact corridor 132. The stud is embedded by a method selected from through-hole electroplating and through-hole electroless plating, and combinations thereof.

At 250, a storage cell dielectric film is formed over the stud. Relating to an embodiment depicted in the FIGS., the storage cell dielectric film 150 is formed by CVD, after the protective film 146 has been etched to isolate the storage cell stud 148.

At 260, a storage cell plate is formed over the storage cell dielectric film. Relating to an embodiment depicted in the FIGS., the storage cell plate 152 is formed by CVD of a metal.

Figure 3:
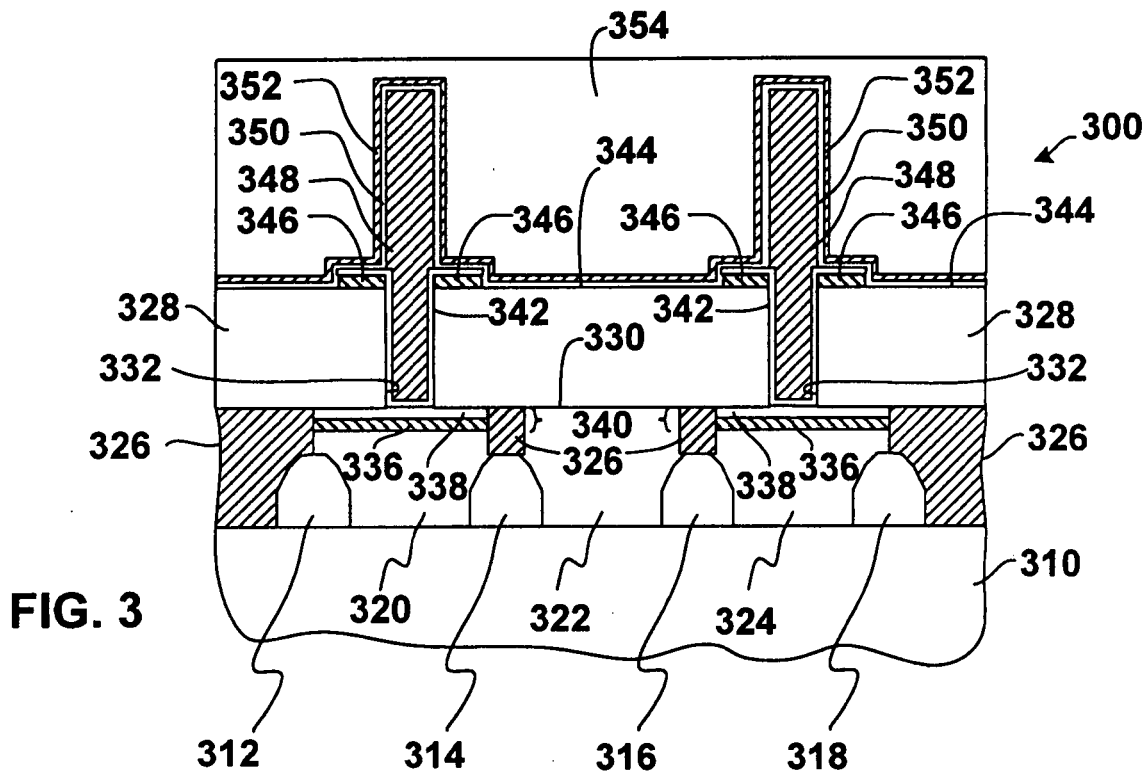
FIG. 3 is a cross section of another stud capacitor structure according to an embodiment.

FIG. 3 is a cross section of another stud capacitor structure 300 according to an embodiment. A substrate 310 includes an active area (not pictured) and a series of gate stacks 312, 314, 316, and 318. Between the gate stacks 312 and 314 is a first cell first conductive plug 320. Between the gate stacks 314 and 316 is a digit line conductive plug 322. And between the gate stacks 316 and 318 is a second cell first conductive plug 324. By way of non-limiting example, the cell first conductive plugs 320, 324 and the digit line conductive plug 322 are isolated from each other by a dielectric 326.

A first dielectric stack 328 is disposed above an upper surface 330 of the cell first conductive plugs 320, 324 and the digit line conductive plug 322. A contact corridor 332 is disposed in the first dielectric stack 328, and a first barrier film 336 is disposed in immediate contact with the first cell first conductive plug 320 and the second cell first conductive plug 324. A second barrier film 338 is disposed in immediate contact with the first barrier film 336. In one embodiment, the first barrier film 336 and the second barrier film 338 are referred to as a barrier structure 340. It is noted that the barrier structure 340 is recessed below the upper surface 330 of the first dielectric stack 328.

A landing pad seed film 342 is disposed in the contact corridor 332 in a conformal manner such that it can have a portion that is within the contact corridor 332 and a portion that is above the upper surface 344 of the first dielectric stack 328. In one embodiment, the seed film 342 has masked a protective film 346 that was used in processing.

A storage cell stud 348 is partially embedded in the contact corridor 332. The storage cell stud 348 also extends above the upper surface 344 of the first dielectric stack 328. The storage cell stud 348 is used as the electrode for a stud capacitor that is one embodiment. A storage cell dielectric film 350 is disposed over the storage cell stud 348. Finally as to the stud capacitor, a storage cell plate 352 is disposed over the storage cell dielectric film 350. Incidental to the structure 300, an upper dielectric stack 354 covers the other structures. The upper dielectric stack 354 is referred to as such because of processing conditions, set forth below.

FIG. 3 illustrates a two-cell structure 300. A digit line (not pictured), in one embodiment a buried digit line is to be brought into contact with the digit line conductive plug 322. Thereby, the stud capacitors can be accessed according to an embodiment. In one embodiment, the gate stack 314 is activated and the left cell either sends or receives a charge. In another embodiment, the gate stack 316 is activated and the right cell either sends or receives a charge.

Figure 3A:
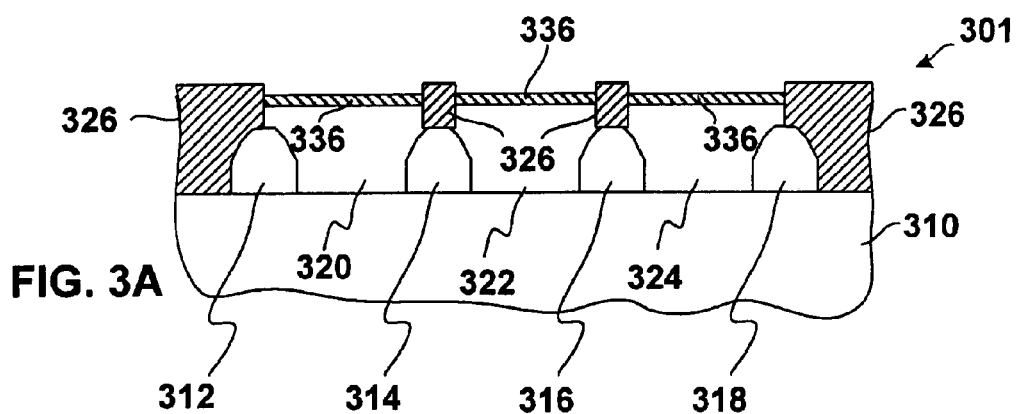
FIG. 3A is a cross section of the stud capacitor structure depicted in FIG. 3 during processing according to another embodiment.

FIG. 3A is a cross section of the stud capacitor structure 301 during processing according to an embodiment. Various processes are carried out to arrive at the stud capacitor structure 301 depicted in FIG. 3A. Processing has resulted in the first cell first conductive plug 320, the digit line conductive plug 322, and the second cell first conductive plug 324. The conductive plugs are formed by depositing a precursor polysilicon (not pictured) and thereafter etching back to form the first cell first conductive plug 320, the digit line conductive plug 122, and the second cell first conductive plug 124. Each of the first cell first conductive plug 320, the digit line conductive plug 322, and the second cell first conductive plug 324 is recessed as a result of the etchback process. Before the conductive plugs 320, 322, and 324 are finished in their dimensions, a salicidation is carried out to form the first barrier film 336. In one embodiment, the first barrier film 336 is made by the deposition of a material such as one of the refractory metals or their combinations set forth above, followed by a salicidation process. Thereafter the unsalicided refractory metal is rinsed according to conventional technique that is selective to the first barrier film 336 and the dielectric 326. In one embodiment, the first barrier film 336 is a metal silicide material, $M_xSi_y$, and the ratios of x to y include both stoichiometric occurrences of metal silicide and other solid solutions.

Figure 3B:
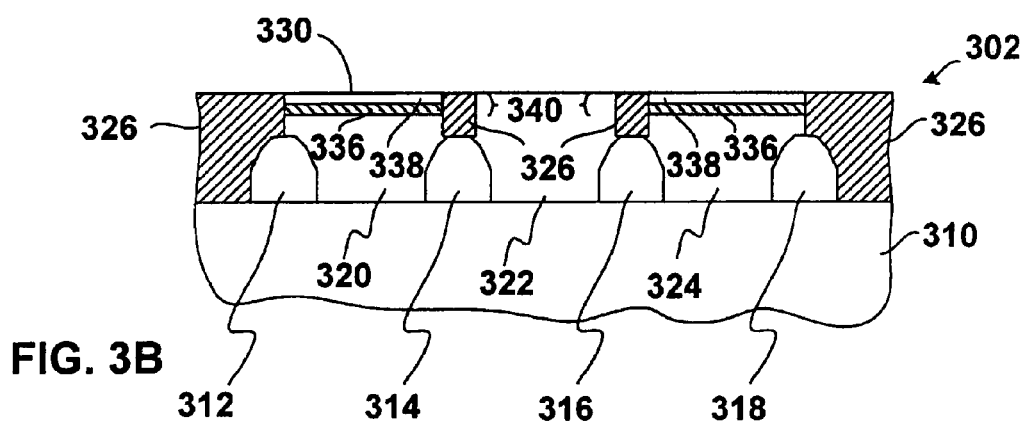
FIG. 3B is a cross section of the structure depicted in FIG. 3A after further processing.

FIG. 3B is a cross section of the structure depicted in FIG. 3A after further processing. After removal of unsalicided material that was used to form the first barrier film 336, the second barrier film 338 is formed. For the sake of illustrative clarity, it is noted that the first and second barrier films are not illustrated between the second gate stack 314 and the third gate stack 316, where the digit line conductive plug 322 is. However, it is understood that a barrier structure would be present unless measures are taken to prevent the formation thereof.

In one embodiment, the second barrier film 338 is a refractory metal nitride material that is sputtered. The refractory metal nitride can include one of the refractory metals or their mixtures as set forth above. In one embodiment, a tantalum nitride second barrier film 338 is formed upon the first barrier film 336.

After deposition of the second barrier film 338, the structure 302 is planarized such as by CMP to obtain the upper surface 330.

Figure 3C:
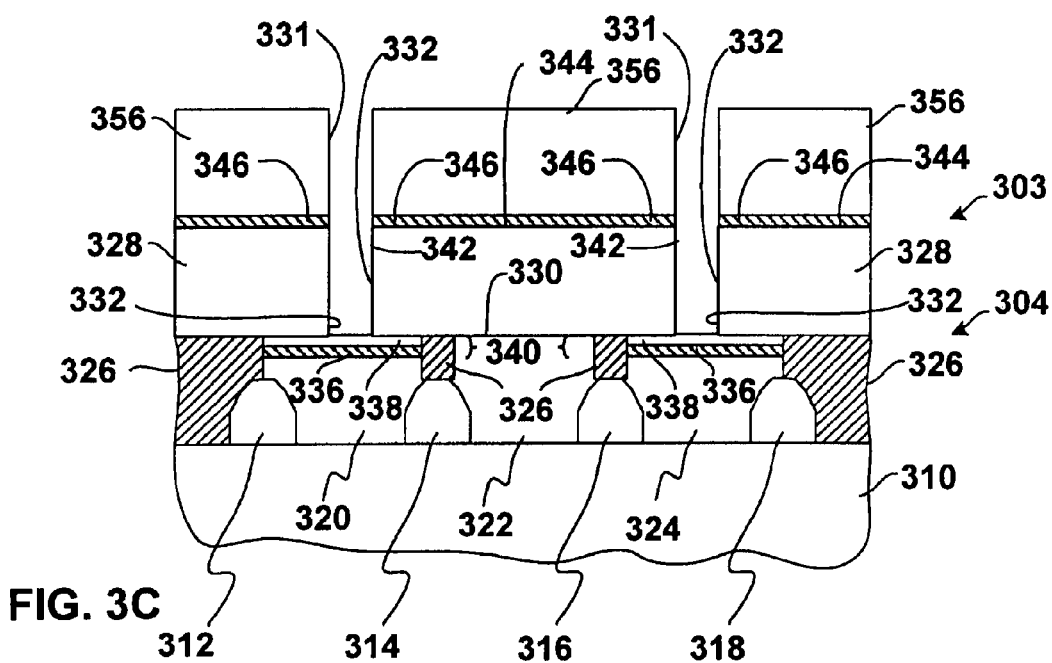
FIG. 3C is a cross section of the structure depicted in FIG. 3B after further processing.

FIG. 3C is a cross section of the structure depicted in FIG. 3B after further processing. The stud capacitor structure 303 has been patterned with a mask 356. The opened pattern 331 is a precursor to the contact corridor 332 that has been etched subsequent to patterning the mask 356. The contact corridor 332 has been opened to expose the second barrier film 338 that surmounts the first and second cell first conductive plugs 320 and 324, respectively, but the digit line conductive plug 322 remains unexposed by the process.

Figure 3D:
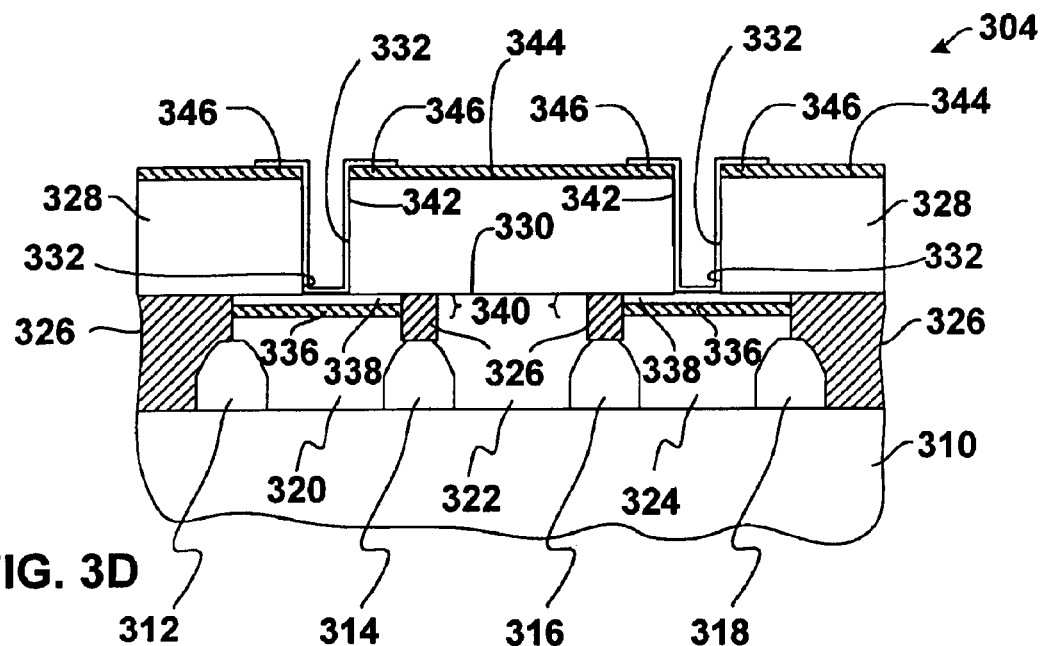
FIG. 3D is a cross section of the structure depicted in FIG. 3C after further processing.

FIG. 3D is a cross section of the structure depicted in FIG. 3C after further processing. After formation of the contact corridor 332 the landing pad seed film 342 is formed by a deposition process. In one embodiment, deposition is carried out by CVD. In one embodiment, deposition is carried out by ALD. In one embodiment, deposition is carried out by PVD. The seed film 342 is used to facilitate subsequent through-hole deposition of a selected stud material. In one embodiment, the seed film 342 is one of the metals or their combinations as set forth above. In one embodiment, the seed film 342 is formed by CVD such that a conformal film coats the sidewalls of the contact corridor 332. Thereafter, a mask (not pictured) is patterned, and the excess seed film is removed by an etch that stops on the protective film 346.

In one embodiment, the seed film 342 includes substantially the same metal as will be deposited by through-hole deposition to form the storage cell stud. In one embodiment, a metal that is not the same as the storage cell stud is used as the seed film 342. In one embodiment, the seed film 342 includes a platinum material in anticipation of the stud being substantially the same platinum that will be formed by through-hole deposition according to known technique.

The size of the mask (not pictured) can overlap the contact corridor 332, onto the protective film 346 to achieve a seed film 342 in the shape depicted in FIG. 3D. In one embodiment, the size of the mask can be narrower, such that there is substantially no material in vertical contact with the protective film 346. Horizontal contact must occur, however, between the seed film 342 and the protective film 346.

Figure 3E:
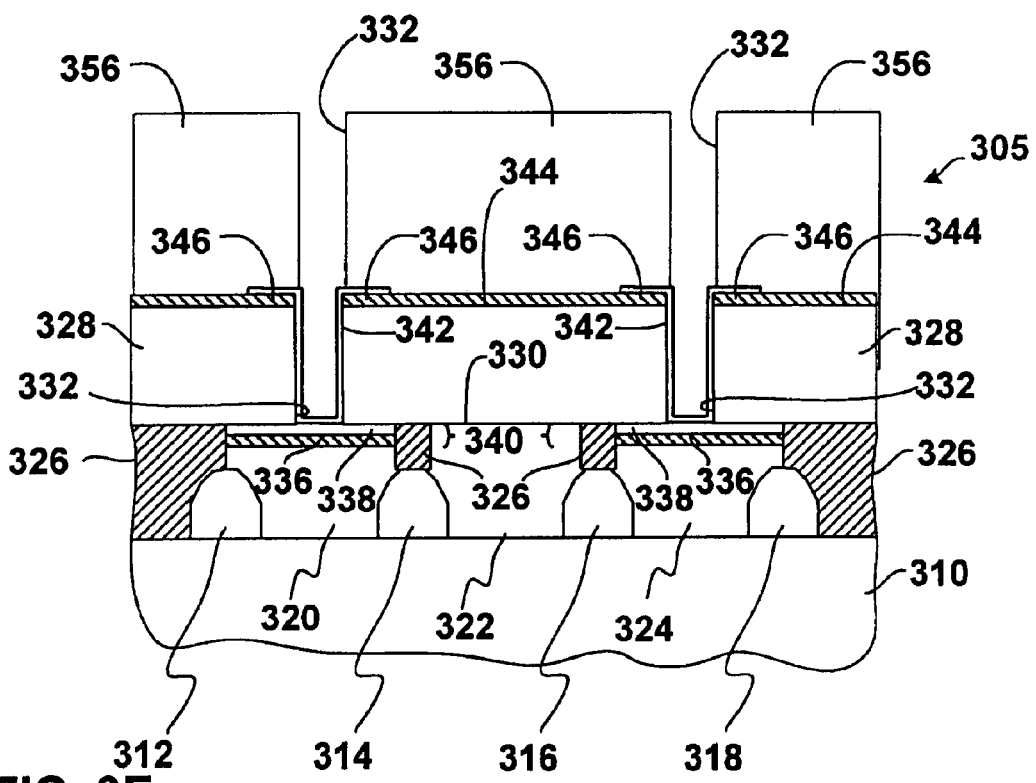
FIG. 3E is a cross section of the structure depicted in FIG. 3D after further processing.

FIG. 3E is a cross section of the structure depicted in FIG. 3D after further processing. In FIG. 3E, the stud capacitor structure 305 has been blanket deposited with a second dielectric stack 356. The second dielectric stack 356 is depicted as having been patterned and etched such that the contact corridor 332 has been re-opened, although it may be wider in the second dielectric stack 356 (see the second dielectric stack 156, FIG. 1E, for example) due to processing limitations. At this process flow, the stud capacitor structure 305 is prepared to receive a stud.

Figure 3F:
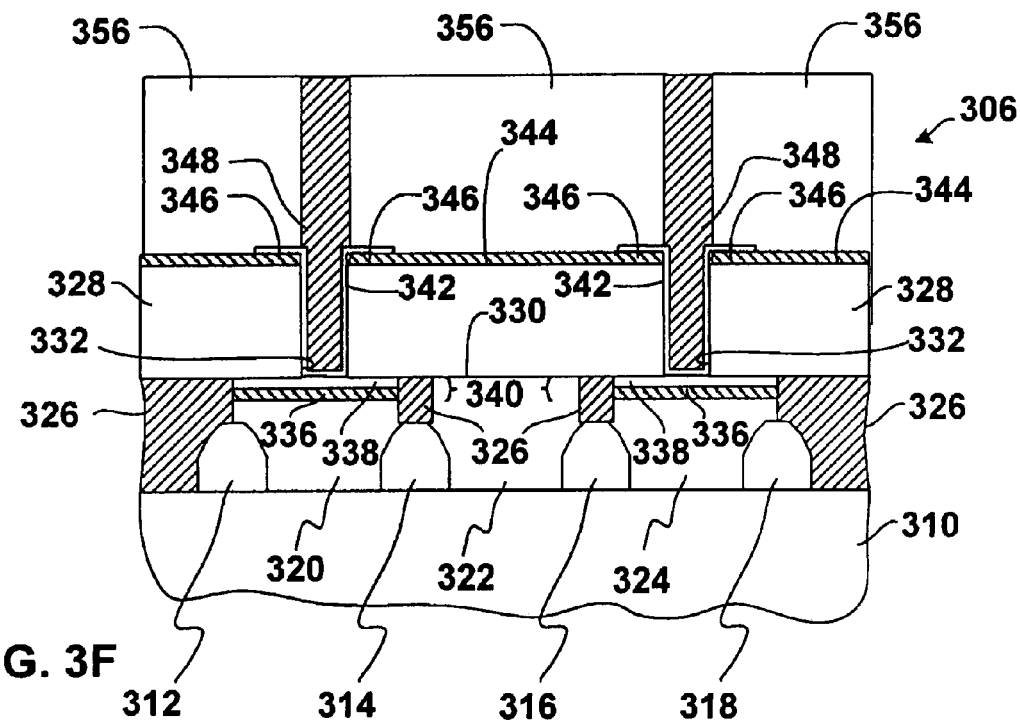
FIG. 3F is a cross section of the structure depicted in FIG. 3E after further processing.

FIG. 3F is a cross section of the structure depicted in FIG. 3E after further processing. The stud capacitor structure 306 has been processed to form the storage cell stud 348. In one embodiment, the seed film 342 is used in an electrolytic through-hole deposition process to form the storage cell stud 348. The protective film 346 is used as a cathode in the electrolytic through-hole deposition process. In one embodiment, the storage cell stud 348 is formed from one of the metals or their combinations as set forth above. In one embodiment, the storage cell stud 348 is a platinum material. In one embodiment, the storage cell stud 348 is a ruthenium material. In one embodiment, the storage cell stud 348 is a rubidium material. In one embodiment, the storage cell stud 348 is an iridium material. In one embodiment, the storage cell stud 348 is a palladium material. In one embodiment, the storage cell stud 348 is an alloy of at least two materials. Because the seed film 342 initially coats the sidewalls of the contact corridor 332, initial deposition can be more rapid due to the increased surface area caused by the coated sidewalls. However, deposition with all other conditions being unchanged, is a function of surface area, deposition can become substantially steady once the storage cell stud 348 is growing above the level of the protective film 346. After deposition is completed, the storage cell stud 348 is planarized as depicted in FIG. 3F.

Figure 3G:
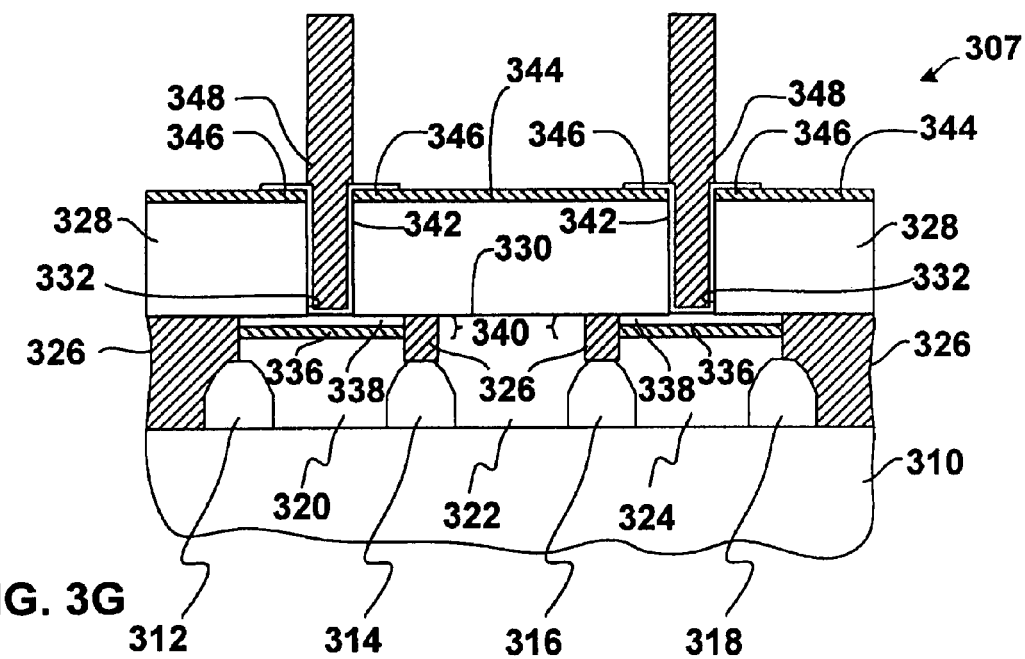
FIG. 3G is a cross section of the structure depicted in FIG. 3F after further processing.

FIG. 3G is a cross section of the structure depicted in FIG. 3F after further processing. The stud capacitor structure 307 has been processed to expose the storage cell stud 348. A rinse or wet etch is carried out to substantially remove the second dielectric stack 356. The stud capacitor structure 307 is then ready to receive a storage cell dielectric film and a storage cell plate.

FIG. 3 is a cross section of the structure depicted in FIG. 3G after further processing. The stud capacitor structure 300 has been processed to isolate the storage cell stud 348 from a cell plate. The protective film 346, that has optionally been used as a cathode source in electrolytic deposition of the storage cell stud 348, is removed by an etch. In one embodiment, the protective film 346 is dry etched. In one embodiment, the protective film 346 is wet etched, such that some undercutting beneath the seed film 342 can occur.

The storage cell dielectric film 350 is next formed. Formation of the storage cell dielectric film 350 can be done by any of the embodiments set forth with respect to the formation of the storage cell dielectric film 150 depicted in FIG. 1

After the formation of the storage cell dielectric film 350, the storage cell plate 352 is formed. In one embodiment the storage cell plate 352 is a metal such as any of the metals that are set forth above. In one embodiment, the storage cell plate 352 is a platinum material, and the storage cell stud 348 is also a platinum material. In one embodiment, the storage cell plate 352 is a first material, and the storage cell stud 348 is a second material that is not qualitatively the same as the first material. The first material and the second material can be selected from the various materials set forth in this disclosure, and from their art-recognized equivalents.

After completion of the stud capacitor structure 300, a third dielectric stack 354 is formed over the stud.

FIG. 4 is a process flow diagram 400 that illustrates various exemplary process embodiments depicted in FIGS. 3 through 3G.

At 410 a barrier structure is formed above a first conductive plug. Relating to an embodiment depicted in the FIGS., the barrier structure 340 is formed above the first cell first conductive plug 320.

At 420, a seed film is formed above the barrier structure. Relating to an embodiment depicted in the FIGS., the seed film 342 is formed by a deposition process to optionally coat the protective film 346 at horizontal surfaces, the sidewalls of the contact corridor 332, and the exposed surface of the second barrier film 338.

At 430, a stud is embedded in the recess. Relating to an embodiment depicted in the FIGS., the stud is the storage cell stud 348 that is embedded partially in the recess that is the contact corridor 332. The stud is embedded by a method selected from electroplating and electroless plating, and combinations thereof.

At 440, a storage cell dielectric film is formed over the stud. Relating to an embodiment depicted in the FIGS., the storage cell dielectric film 350 is formed by CVD, after the protective film 346 has been etched to isolate the storage cell stud 348.

At 450, a storage cell plate is formed over the storage cell dielectric film. Relating to an embodiment depicted in the FIGS., the storage cell plate 352 is formed by CVD of a metal.

In all embodiments, the characteristic dimension of various features is tied to the process photolithography. In one embodiment, the characteristic dimension is the critical dimension of a set of photolithographic design rules. By way of further reference, according to design rules, a characteristic dimension may be part of the metric of the structure depicted in FIGS. 1 or 3. In this embodiment, the minimum feature may be the diameter of a contact corridor that accommodates the polysilicon conductive plug. Accordingly, the characteristic dimension is the minimum feature. For example, photolithography process flows may have a minimum feature geometry that is one of 0.25 micrometers (microns), 0.18 microns, 0.15 microns, 0.13 microns, and 0.11 microns. It is understood that the various metrics such as a 0.15-micron photolithography geometry may have different dimensions in a first business entity compared to a second business entity. Accordingly, such metrics, although quantitatively called out, can differ between two given business entities. Other minimum features that may be accomplished in the future are applicable to the various embodiments.

FIGS. 5 through 10 illustrate other embodiments. The processes and structures that are achieved in the various embodiments are inventively applicable to a variety of devices and apparatuses. Specific systems can be made by process embodiments, or that include an embodiment or embodiments of the structure as disclosed herein. For example, a chip package can contain a stud capacitor DRAM structure according to an embodiment. In one embodiment, the DRAM structure is operated in synchronous DRAM ("SDRAM") mode. In one embodiment, the DRAM structure is operated in double data-rate DRAM ("DDRAM") mode.

In another example, the stud capacitor is coupled to a sense amplifier, or a trace between active devices on a substrate. In one embodiment, an array of stud capacitors is part of a 2-dimensional array of storage devices such as a DRAM array. In another embodiment, the stud capacitor structure is part of an electrical device that includes the semiconductor substrate in a chip package and the chip package is part of a memory module or part of a chipset. In another embodiment, the memory module is part of a DRAM module that is inserted into a host such as a motherboard or a digital computer. In another embodiment, specific systems can be made that include the stud capacitor structure. For example, a chip package can contain a stud capacitor structure such as one set forth in this disclosure. In another embodiment, the stud capacitor structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the stud capacitor structure is part of an electronic system. In another embodiment, the stud capacitor structure is fabricated with a floating gate. In another embodiment, the stud capacitor structure is fabricated with a floating gate that is part of a flash memory device that in turn is part of a chipset such as a basic input-output system (BIOS) for an electrical device.

FIG. 5 is a top view of a wafer 500 or substrate containing semiconductor dies in accordance with an embodiment. With reference to FIG. 5, a semiconductor die 510 can be produced from the silicon wafer 500 that contains at least one of the stud capacitor structures such as are depicted in the FIGS. A die 510 is an individual pattern, typically rectangular, on a substrate such as substrate 110 (FIG. 1) or substrate 310 (FIG. 3) that contains circuitry to perform a specific function. A semiconductor wafer 500 will typically contain a repeated pattern of such dies 510 containing the same functionality. The die 510 can further contain additional circuitry to extend to such complex devices as a monolithic processor with multiple functionality. The die 510 is typically packaged in a protective casing (not shown) with leads extending therefrom (not shown) providing access to the circuitry of the die 510 for unilateral or bilateral communication and control. In one embodiment, the die 510 is incased in a host such as a chip package (not shown) such as a chip-scale package (CSP).

FIG. 6 is a block diagram of a circuit module 600 in accordance with an embodiment. As shown in FIG. 6, two or more dies 510 at least one of which contains at least one stud capacitor structure such as are depicted in FIGS. 1 and 3 in accordance with various embodiments can be combined, with or without protective casing, into a host such as a circuit module 600 to enhance or extend the functionality of an individual die 510. Circuit module 600 can be a combination of dies 510 representing a variety of functions, or a combination of dies 510 containing the same functionality. Some examples of a circuit module 600 include memory modules, device drivers, power modules, communication modems, processor modules and application-specific modules and can include multi-layer, multi-chip modules. Circuit module 600 can be a sub-component of a variety of electronic systems, such as a clock, a television, a cell phone, a personal computer, an automobile, an industrial control system, an aircraft, a hand-held, and others. Circuit module 600 will have a variety of leads 610 extending therefrom providing unilateral or bilateral communication and control. In another embodiment, circuit module 600 includes the stud capacitor structure depicted in FIG. 1 or in FIG. 3 as a two-cell precursor that will be fabricated into a storage device.

FIG. 7 is a block diagram of a memory module 700 in accordance with an embodiment. FIG. 7 shows one embodiment of a circuit module as a memory module 700 containing a stud capacitor structure embodiment such as are depicted in FIGS. 1 and 3. Memory module 700 is a host that generally depicts a Single In-line Memory Module ("SIMM") or Dual In-line Memory Module ("DIMM"). A SIMM or DIMM can generally be a printed circuit board ("PCB") or other support containing a series of memory devices. While a SIMM will have a single in-line set of contacts or leads, a DIMM will have a set of leads on each side of the support with each set representing separate I/O signals. Memory module 700 contains multiple memory devices 710 contained on a support 715, the number depending upon the desired bus width and the desire for parity. Memory module 700 can contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

FIG. 8 is a block diagram of an electronic system 800 in accordance with another embodiment. FIG. 8 shows another host type such as an electronic system 800 containing one or more circuit modules 600 as described above containing at least one of the stud capacitor structures. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch or gas pedal of an automobile; and the card reader, keypad, display and currency dispenser of an automated teller machine. User interface 810 can further describe access ports provided to electronic system 800. Access ports are used to connect an electronic system to the more tangible user interface components previously exemplified. One or more of the circuit modules 600 can be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 can be a sub-component of a larger electronic system.

Figure 9:
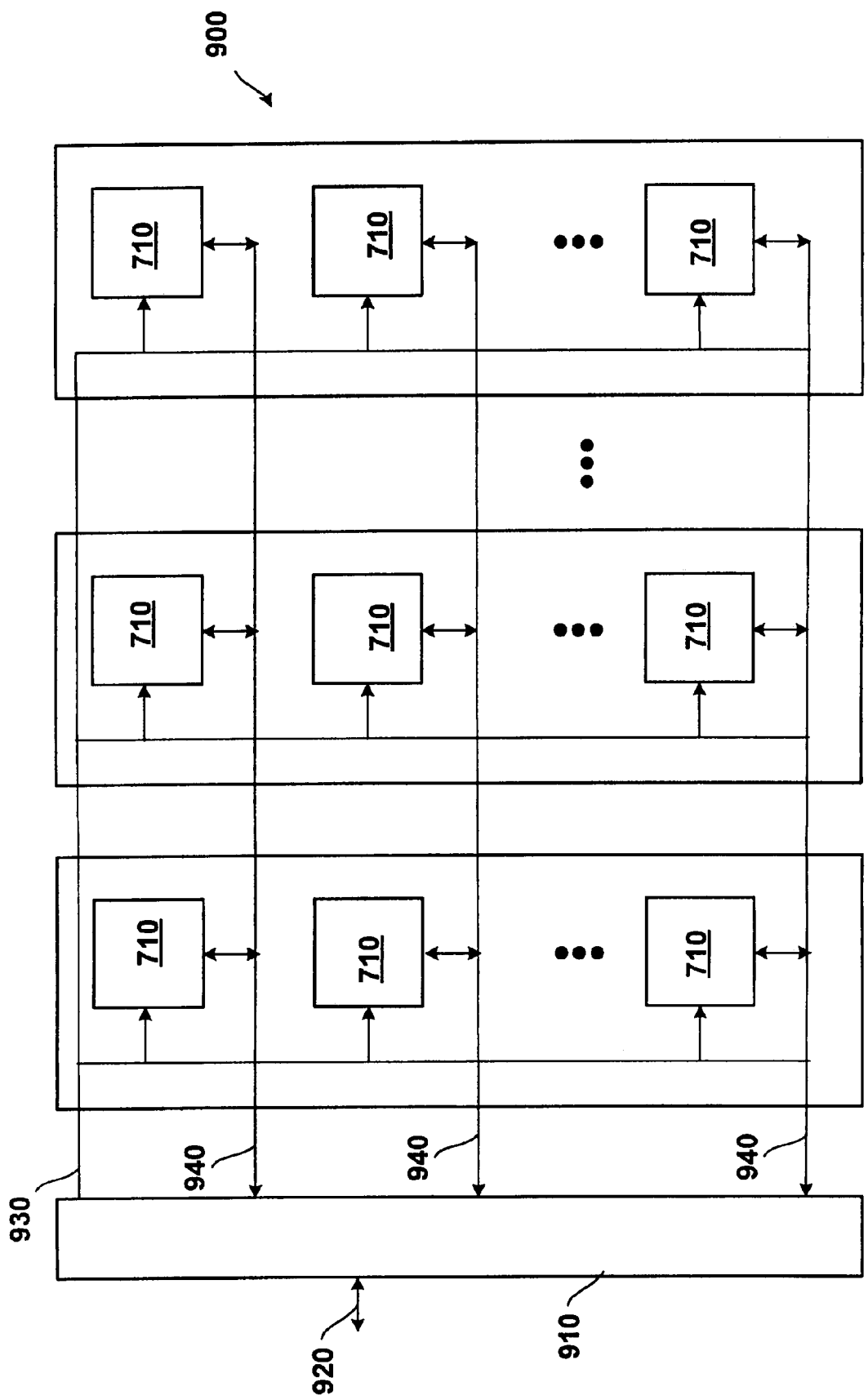
FIG. 9 is a block diagram of a memory system in accordance with an embodiment.

FIG. 9 is a block diagram of a memory system 900 in accordance with an embodiment. FIG. 9 shows one embodiment of an electrical device at a system level. Memory system 900 acts as a higher-level host that contains one or more memory devices 710 as described above including at least one of the stud capacitor structures as set forth herein in accordance with various embodiments, and a memory controller 910 that can also include circuitry that is connected with a stud capacitor structure as set forth herein. Memory controller 910 provides and controls a bidirectional interface between memory system 900 and an external system bus 920. Memory system 900 accepts a command signal from the external system bus 920 and relays it to the one or more memory devices 710 on a command link 930. Memory system 900 provides for data input and data output between the one or more memory devices 710 and external system bus 920 on data links 940.

Figure 10:
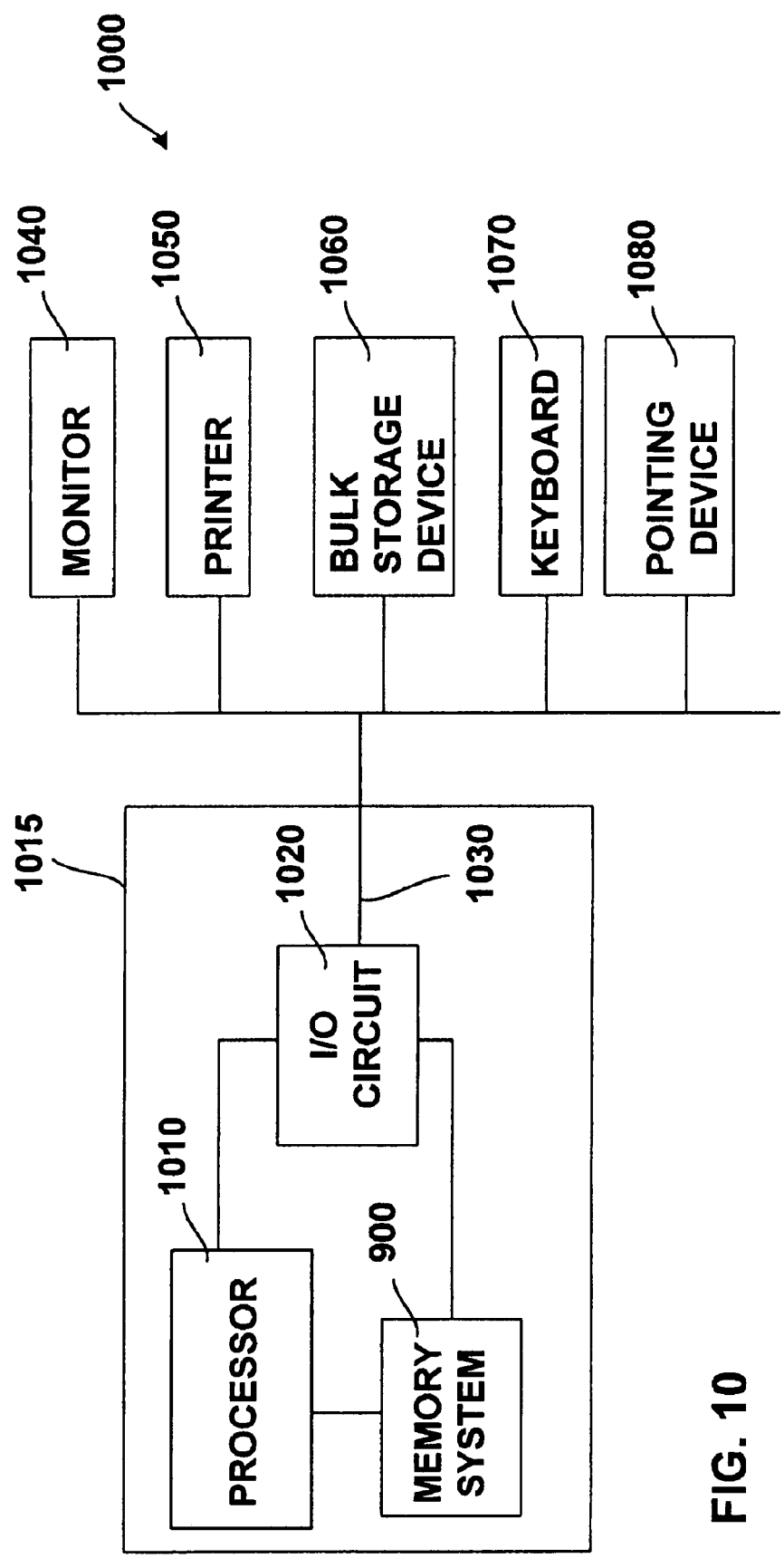
FIG. 10 is a block diagram of a computer system in accordance with an embodiment.

FIG. 10 is a block diagram of a computer system 1000 in accordance with an embodiment. FIG. 10 shows a further embodiment of an electronic system as a computer system 1000. Computer system 1000 contains a processor 1010 and a memory system 900 housed in a computer unit 1015. Computer system 1000 is but one example of an electronic system containing another electronic system, i.e. memory system 900, as a sub-component. The computer system 1000 can contain an input/output (I/O) circuit 1020 that is coupled to the processor 1010 and the memory system 900. Computer system 1000 optionally contains user interface components that are coupled to the I/O circuit 1020. In accordance with the various embodiments, a plurality of stud capacitor structures can be coupled to one of a plurality of I/O pads or pins 1030 of the I/O circuit 1020. The I/O circuit 1020 can then be coupled a monitor 1040, a printer 1050, a bulk storage device 1060, a keyboard 1070 and a pointing device 1080. It will be appreciated that other components are often associated with computer system 1000 such as modems, device driver cards, additional storage devices, etc. It will further be appreciated that the processor 1010, memory system 900, I/O circuit 1020 and partially isolated structures or data storage devices of computer system 1000 can be incorporated on a single integrated circuit, and/or that each of them can include a stud capacitor structure according to an embodiment. Such single package processing units reduce the communication time between the processor 1010 and the memory system 1000.

CONCLUSION

Thus has been shown processes that result in at least one stud capacitor structure. The stud capacitor structure includes an embedded stud that achieves a charge capacitance. The stud capacitor structure can be fabricated by various embodiments that include a polysilicon plug or a barrier film that is disposed on the polysilicon conductive plug for the storage cell.

In one embodiment, a stud capacitor structure includes a substrate containing semiconductor devices that provides contacts at the surface which are connected to the lower semiconductor devices. A first dielectric stack is disposed above the upper surface of the substrate. A contact corridor is opened in the first dielectric stack, and a first conductive plug is disposed in the contact corridor. A barrier structure is disposed in immediate contact with the first conductive plug. A seed film is disposed in the contact corridor in contact with the barrier structure. The seed film may extend along the sidewalls of the contact corridor to the surface of the dielectric stack and may further extend laterally from the contact corridor on the surface of the first dielectric stack. The seed film must, however, remain electrically isolated from neighboring contact corridors. A storage cell stud is partially embedded in the contact corridor in contact with the seed film. Additionally, the storage cell stud is used as the stud electrode for a stud capacitor that is one embodiment. A storage cell dielectric film is disposed over the storage cell stud. A storage cell plate is disposed over the storage cell dielectric film.

In one embodiment a process is disclosed. The structure is subjected to various processes to arrive at a stud capacitor structure with an embedded stud. A first conductive plug is formed by deposition and etchback. A diffusion barrier protective structure is formed above the first conductive plug. In one embodiment, the diffusion barrier is formed above and on a second conductive plug that is in a contact corridor above the first conductive plug. In one embodiment, the diffusion barrier is formed above and on the first conductive plug.

A seed film is formed over the diffusion barrier in the contact corridor. The seed film is used to facilitate the electroplating of the storage cell stud. A dielectric stack is formed above the seed film, and a second contact corridor is opened that exposes the seed film. In one embodiment, an electrolytic through-hole deposition process is used to form the storage cell stud. In one embodiment, an electroless plating process is carried out to form a through-hole storage cell stud. In one embodiment, the storage cell stud is formed from the same metal as the seed film.

Subsequent to the formation of the storage cell stud, a storage cell dielectric film is formed. In one embodiment, a high permittivity material is selected. After the formation of the storage cell dielectric film a storage cell plate is formed. In one embodiment, the storage cell plate is the same material as the storage cell stud.

In another embodiment, a variety of devices and apparatuses can be manufactured that include the storage cell stud. In another embodiment, specific systems can be made that include the stud capacitor structure. For example, a chip package can contain a stud capacitor structure such as one set forth in this disclosure. In another embodiment, the stud capacitor structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the stud capacitor structure is part of an electronic system.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate embodiment.

While various embodiments have been described and illustrated with respect to forming buried digit line structures, it should be apparent that the same processing techniques can be used to form other structures by the stacked film techniques set forth in this disclosure for other applications. Furthermore, the processes described herein may be used in the development of other three-dimensional semiconductor structures, as well as in the development of other semiconductor structures, such as gates, interconnects, contact pads, and more.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A stud capacitor structure comprising:
a first conductive plug disposed above a substrate;
a stud coupled to the first conductive plug, the stud being
partially embedded within a contact corridor in a first dielectric stack, wherein a width of the stud extending from the first dielectric stack is greater than a width of the contact corridor; and
an upper dielectric stack disposed above the first dielectric stack, wherein the stud extends into the upper dielectric stack.

2. The stud capacitor structure according to claim 1, the structure including a seed film disposed above the first conductive plug, wherein the seed film is below and on the stud.

3. The stud capacitor structure according to claim 1, the structure including:
a storage cell dielectric film disposed over the stud; and
a storage cell plate disposed over the storage cell dielectric film.

4. The stud capacitor structure according to claim 1, the structure including a storage cell dielectric film disposed over the stud, wherein the storage cell dielectric film has a thickness in a range from about 30 Å to about 80 Å.

5. The stud capacitor structure according to claim 1, the structure including a storage cell dielectric film disposed over the stud, wherein the storage cell dielectric film is selected from titanium oxide, tantalum oxide, aluminum oxide, strontium titanate, barium strontium titanate, lead titanate, lead lanthanum titanate, lead lanthanum zirconium tantalate, lead zirconium titanate, strontium bismuth tantalate, and combinations thereof.

6. The stud capacitor structure according to claim 1, the structure including:
a storage cell dielectric film disposed over the stud, wherein the storage cell dielectric film has a dielectric constant range from about 9 to about 300; and
a storage cell plate disposed over the storage cell dielectric film.

7. The stud capacitor structure according to claim 1, the structure including:
a storage cell dielectric film disposed over the stud; and
a storage cell plate disposed over the storage cell dielectric film, wherein the storage cell plate is selected from the same material as the stud, platinum, rhodium, ruthenium, iridium, palladium, nickel, combinations thereof, and an alloy.

8. The stud capacitor structure according to claim 1, the structure including:
a storage cell dielectric film disposed over the stud; and
a storage cell plate disposed over the storage cell dielectric film, wherein the storage cell plate is a different material from the stud, selected from a metal nitride, titanium nitride, tantalum nitride, and tungsten nitride.

9. The stud capacitor structure according to claim 1, the structure including a barrier structure disposed between and in contact with the stud above and the first conductive plug below.

10. The stud capacitor structure according to claim 1, the structure including a barrier structure disposed between and in contact with the stud above and the first conductive plug below, wherein the barrier structure is disposed above a polysilicon plug.

11. The stud capacitor structure according to claim 1, the structure including a barrier structure disposed between and in contact with the stud above and the first conductive plug below, wherein the barrier structure is disposed above a tungsten plug.

12. The stud capacitor structure according to claim 1, the structure including a barrier structure disposed between and in contact with the stud above and the first conductive plug below, wherein the barrier structure is disposed above and on the first conductive plug.

13. The structure of claim 1, wherein the stud extends in a vertical dimension that is significantly greater than the horizontal dimension.

14. The stud capacitor structure according to claim 2, wherein the seed film is embedded in the first dielectric stack.

15. An electronic system, comprising:
a circuit module;
a user interface; and
a stud capacitor structure disposed in the circuit module or the user interface, the stud capacitor structure including:
a first conductive plug disposed above a substrate;
a stud coupled to the first conductive plug, the stud being partially embedded within a contact corridor in a first dielectric stack, wherein a width of the stud extending from the first dielectric stack is greater than a width of the contact corridor; and
an upper dielectric stack disposed above the first dielectric stack, wherein the stud extends into the upper dielectric stack.

16. The electronic system according to claim 15, wherein the user interface includes at least one of a keyboard, a pointing device, a monitor, a printer, a tuning dial, a display and speakers of a radio, an automobile ignition switch, an automobile gas pedal, a card reader, a keypad, and an automated teller machine.

17. The electronic system according to claim 15, wherein the circuit module includes a single integrated circuit.

18. The electronic system of claim 15, wherein the stud capacitor structure includes a protective film remnant that is part of the first dielectric stack.

19. The electronic system of claim 15, wherein the stud capacitor structure includes a seed film disposed above the first conductive plug.

20. The electronic system of claim 19, wherein the seed film includes platinum.

21. The electronic system of claim 19, wherein the seed film includes a portion embedded in the first dielectric stack.

22. A memory system, comprising:
a memory device;
a memory controller;
an external system bus;
a command link; and
a stud capacitor structure disposed in the circuit module or the user interface, the stud capacitor structure including:
a first conductive plug disposed above a substrate;
a stud coupled to the first conductive plug, the stud being partially embedded within a contact corridor in a first dielectric stack, wherein a width of the stud extending from the first dielectric stack is greater than a width of the contact corridor; and
an upper dielectric stack disposed above the first dielectric stack, wherein the stud extends into the upper dielectric stack.

23. The memory system according to claim 22, wherein the memory system is selected from one of DIMM DRAM, a SIMM DRAM, a DIMM SDRAM, a SIMM SDRAM, a DTMM DDRAM, and a SIMM DDRAM.

* * * * *

UNITED STATES PATENT AND TRADEMARK OFFICE
CERTIFICATE OF CORRECTION

PATENT NO.        : 7,498,629 B2
APPLICATION NO.   : 11/786219
DATED             : March 3, 2009
INVENTOR(S)       : Graettinger It is certified that error appears in the above-identified patent and that said Letters Patent is hereby corrected as shown below:

In column 18, line 62, in Claim 23, delete "DTMM" and insert -- DIMM --, therefor.

Signed and Sealed this

Fifth Day of May, 2009

JOHN DOLL
*Acting Director of the United States Patent and Trademark Office*